United States Patent
Li et al.

(10) Patent No.: US 12,316,282 B2
(45) Date of Patent: May 27, 2025

(54) COMPENSATION CIRCUIT AND CHIP, METHOD, APPARATUS, STORAGE MEDIUM, AND ELECTRONIC DEVICE

(71) Applicant: SANECHIPS TECHNOLOGY CO., LTD., Shenzhen (CN)

(72) Inventors: Jijun Li, Shenzhen (CN); Jingjing Dong, Shenzhen (CN); Guoliang Zhao, Shenzhen (CN); Zhongyi Chen, Shenzhen (CN)

(73) Assignee: SANECHIPS TECHNOLOGY CO., LTD., Shenzhen (CN)

( * ) Notice: Subject to any disclaimer, the term of this patent is extended or adjusted under 35 U.S.C. 154(b) by 559 days.

(21) Appl. No.: 17/638,498

(22) PCT Filed: Aug. 26, 2020

(86) PCT No.: PCT/CN2020/111361
§ 371 (c)(1),
(2) Date: Feb. 25, 2022

(87) PCT Pub. No.: WO2021/037054
PCT Pub. Date: Mar. 4, 2021

(65) Prior Publication Data
US 2022/0393649 A1    Dec. 8, 2022

(30) Foreign Application Priority Data
Aug. 30, 2019   (CN) .......................... 201910817751.5

(51) Int. Cl.
*H03F 1/32* (2006.01)
*H03F 1/30* (2006.01)
*H03F 3/45* (2006.01)

(52) U.S. Cl.
CPC ........... *H03F 1/3205* (2013.01); *H03F 1/301* (2013.01); *H03F 3/45475* (2013.01); *H03F 2201/3218* (2013.01)

(58) Field of Classification Search
CPC .... H03F 1/3205; H03F 1/301; H03F 3/45475; H03F 2201/3218; H03F 1/3211; H03F 1/3223; H03F 1/32; G06F 30/36
(Continued)

(56) References Cited

U.S. PATENT DOCUMENTS

| | | | |
|---|---|---|---|
| 6,188,281 B1 | 2/2001 | Smith et al. | |
| 2003/0045264 A1* | 3/2003 | Jeong | H03F 1/3229 455/334 |

(Continued)

FOREIGN PATENT DOCUMENTS

| | | | |
|---|---|---|---|
| CN | 104348419 A | 2/2015 | |
| CN | 105811889 A * | 7/2016 | ............... H03F 1/14 |

(Continued)

OTHER PUBLICATIONS

Japan Patent Office. Notice of Reasons for Refusal for JP Application No. 2021-565829 and English translation, mailed Jan. 24, 2023, pp. 1-18.

(Continued)

*Primary Examiner* — Andrea Lindgren Baltzell
*Assistant Examiner* — Jose E Pinero
(74) *Attorney, Agent, or Firm* — Vivacqua Crane, PLLC

(57) ABSTRACT

A compensation circuit, chip, method and device, a storage medium, and an electronic device are disclosed. The compensation circuit may include an analog module (102) including an input node (1022) and an output node (1024), wherein the input node (1022) is configured to receive an input signal and the output node (1024) is configured to output an output signal; and a linearity compensation mod- (Continued)

ule (104) including a plurality of transconductance units (1042), where the plurality of transconductance units (1042) are configured to acquire a first configuration signal and configure a combination of the plurality of transconductance units (1042) based on the first configuration signal to provide a compensation signal to the output node (1024), and the first configuration signal is configured to indicate a signal at any position in the analog module (102).

20 Claims, 7 Drawing Sheets

(58) Field of Classification Search
USPC .......................................................... 330/277
See application file for complete search history.

(56) References Cited

U.S. PATENT DOCUMENTS

| | | |
|---|---|---|
| 2007/0096813 A1 | 5/2007 | Nam et al. |
| 2017/0005622 A1 | 1/2017 | Fitzi |

FOREIGN PATENT DOCUMENTS

| | | | |
|---|---|---|---|
| CN | 106411273 | A | 2/2017 |
| CN | 107370461 | A | 11/2017 |
| JP | H05136636 | A | 6/1993 |
| JP | H08242130 | A | 9/1996 |
| JP | H11103218 | A | 4/1999 |
| JP | 2002526960 | A | 8/2002 |
| JP | 2004274439 | A | 9/2004 |
| JP | 2014179886 | A | 9/2014 |
| KR | 20070047039 | A | 5/2007 |
| WO | 2009016716 | A1 | 2/2009 |
| WO | 2010119456 | A2 | 10/2010 |

OTHER PUBLICATIONS

Japan Patent Office. Search Report for JP Application No. 2021-262829 and English translation, mailed Dec. 21, 2022, pp. 1-90.
International Searching Authority. International Search Report and Written Opinion for PCT Application No. PCT/CN2020/111361 and English translation, mailed Nov. 30, 2020, pp. 1-11.
European Patent Office. Extended European Search Report for EP Application No. 20858148.8, mailed Jun. 1, 2022, pp. 1-11.
Krishnapura, et al. "A High-IIP3 Third-Order Elliptic Filter With Current-Efficient Feedforward-Compensated Opamps," IEEE Transactions on Circuits and Systems, vol. 58, No. 4, Apr. 2011, pp. 205-209.
European Patent Office. Communication pursuant to Article 94(3) for EP Application No. 20858148.8, mailed Jul. 25, 2024, pp. 1-9.
Thyagarajan, S.V., et al., "Low distortion active filters using the Gm-assisted OTA-RC technique," Proceedings of the IEEE, Sep. 2010, pp. 162-165.
The State Intellectual Property Office of People's Republic of China. First Office Action and Search Report for CN Application No. 201910817751.5 and English translation, mailed Apr. 8, 2025, pp. 1-22.

* cited by examiner

| Acquire, by a linearity compensation module, a plurality of first configuration signals, and configure combinations of a plurality of transconductance units based on the first configuration signals to provide compensation signals to the output nodes, each first configuration signal being configured to indicate a signal at any position in the analog module | S302 |

FIG. 8

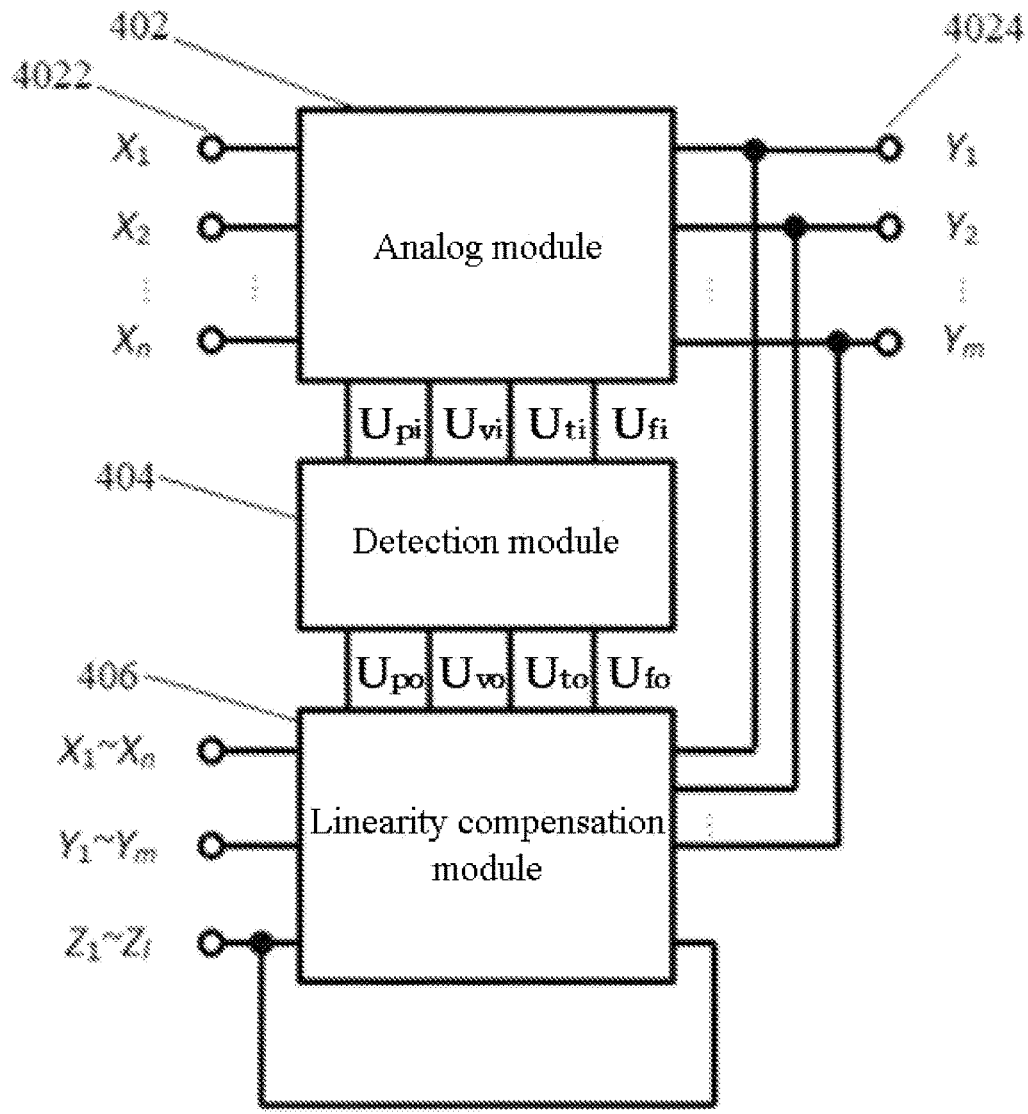

FIG. 9

COMPENSATION CIRCUIT AND CHIP, METHOD, APPARATUS, STORAGE MEDIUM, AND ELECTRONIC DEVICE

CROSS-REFERENCE TO RELATED APPLICATION

This application is a national stage filing under 35 U.S.C. § 371 of international application number PCT/CN2020/111361, filed Aug. 26, 2020, which claims priority to Chinese patent application No. 201910817751.5 filed Aug. 30, 2019. The contents of these applications are incorporated herein by reference in their entirely.

TECHNICAL FIELD

The present disclosure relates to the field of electronics, and in particular to a compensation circuit, chip, method and device, a storage medium, and an electronic device.

BACKGROUND

With the development of wireless communication systems, the signal bandwidth of analog channels has increased significantly, and the design of broadband analog signal processing circuits, such as analog active Resistor-Capacitance (RC) filters, transimpedance amplifiers and Delta-Sigma modulators, is facing severe challenges. Linearity, as an important index in wireless communication systems, directly determines the overall performance of the broadband analog signal processing circuit. Taking the circuit design of an operational transconductance amplifier (OTA) as an example, the OTA in an analog circuit needs to maintain sufficient open-loop gain over a wide frequency range in order to suppress nonlinearities. However, in analog integrated circuits adopting an advanced complementary metal oxide semiconductor (CMOS) technology, the OTA with high gain and large bandwidth is usually designed relying on extra power consumption and chip area overhead, which severely limits the disclosure of analog signal processing circuits in wireless communication systems. In order to reduce the design difficulty and cost of OTA, there is a need to adopt an appropriate linearity compensation scheme to compensate the linearity of the OTA, so as to improve the linearity performance of analog circuits. However, in related technologies, due to the lack of comprehensive consideration of nonlinearity sources and influencing factors in the process of linearity compensation, only some nonlinear factors can be compensated, which in turn results in large deviations in the effect of actual linearity compensation and poor reliability and practicability.

In view of the problem of large deviations in linearity compensation due to the lack of comprehensive consideration of nonlinearity sources and influencing factors in the process of linearity compensation in the above related technologies, no effective solution has been proposed in the related technologies.

SUMMARY

Embodiments of the present disclosure provides a compensation circuit, chip, method and device, a storage medium, and an electronic device to at least solve the problem of large deviations in linearity compensation due to the lack of comprehensive consideration of nonlinearity sources and influencing factors in the linearity compensation process in related technologies.

According to an embodiment of the present disclosure, a compensation circuit is provided, the compensation circuit may include:

an analog module including an input node and an output node, where the input node is configured to receive an input signal and the output node is configured to output an output signal;

a linearity compensation module including a plurality of transconductance units, where the plurality of transconductance units are configured to acquire a first configuration signal and configure a combination of the plurality of transconductance units based on the first configuration signal to provide a compensation signal to the output node, and the first configuration signal is configured to indicate a signal at any position in the analog module.

According to another embodiment of the present disclosure, a compensation chip is further provided, the compensation chip may include the compensation circuit in the above embodiment.

According to another embodiment of the present disclosure, a compensation method for providing a compensation signal to an analog module including an input node and an output node is provided, the method may include following steps of:

acquiring a first configuration signal and configuring a combination of a plurality of transconductance units based on the first configuration signal to provide the compensation signal to the output node, where the first configuration signal is configured to indicate a signal at any position in the analog module.

According to another embodiment of the present disclosure, a compensation circuit is further provided, the compensation circuit may include:

an analog module including an input node and an output node, where the input node is configured to receive an input signal and the output node is configured to output an output signal;

a detection module configured to detect operating information of the analog module and provide a second configuration signal based on the operating information; and a linearity compensation module configured to acquire a first configuration signal and the second configuration signal, and provide compensation signals to the output nodes based on the first configuration signal and/or second configuration signal, where the first configuration signal is configured to indicate a signal at any position in the analog module.

According to another embodiment of the present disclosure, a compensation chip is further provided, the compensation chip may include the compensation circuit in the above embodiment.

According to another embodiment of the present disclosure, a compensation method for providing a compensation signal to an analog module including an input node and an output node is further provided, the method may include following steps of:

detecting operating information of the analog module and providing a second configuration signal based on the operating information; and acquiring a first configuration signal and the second configuration signal, and providing the compensation signal to the output node based on the first configuration signal and/or second configuration signal, where the first configuration signal is configured to indicate a signal at any position in the analog module.

According to another embodiment of the present disclosure, a compensation device configured to provide a compensation signal to an analog module including an input node and an output node is further provided, the compensation device may include:

a compensation module configured to acquire a first configuration signal and configure a combination of a plurality of transconductance units based on the first configuration signal to provide the compensation signal to the output node, where the first configuration signal is configured to indicate a signal at any position in the analog module.

According to another embodiment of the present disclosure, a compensation device configured to provide a compensation signal to an analog module including an input node and an output node is further provided, the compensation device may include:

a provision module configured to detect operating information of the analog module and provide a second configuration signal based on the operating information; and a compensation module configured to acquire a first configuration signal and the second configuration signal, and provide the compensation signal to the output node based on the first configuration signal and/or second configuration signal, where the first configuration signal is configured to indicate a signal at any position in the analog module.

According to another embodiment of the present disclosure, a storage medium storing a computer program is further provided, where the computer program, when executed, performs steps of the method in any of the above embodiments.

According to another embodiment of the present disclosure, an electronic device is further provided, including a memory and a processor, where the memory stores a computer program which, when executed by the processor, causes the processor to perform steps of the method in any of the above embodiments.

BRIEF DESCRIPTION OF DRAWINGS

The accompanying drawings illustrated herein serve to provide a further understanding of and constitute a part of the present disclosure. The embodiments of the present disclosure and descriptions thereof are provided to explain the present disclosure and are not intended to be construed as unduly limiting the present disclosure. In the accompanying drawings:

FIG. 8 is a flowchart (I) of a compensation method provided according to an embodiment of the present disclosure;

FIG. 9 is a functional diagram (II) of a compensation circuit provided according to an embodiment of the present disclosure;

DETAILED DESCRIPTION

The present disclosure will be described below with reference to the accompanying drawings by way of embodiments.

It should be noted that the terms "first", "second" and the like in the specification and claims of the present disclosure and the above accompanying drawings are used for distinguishing similar objects, but not necessarily used for describing a specific sequence or a precedence order.

Embodiment One

Figure 1:
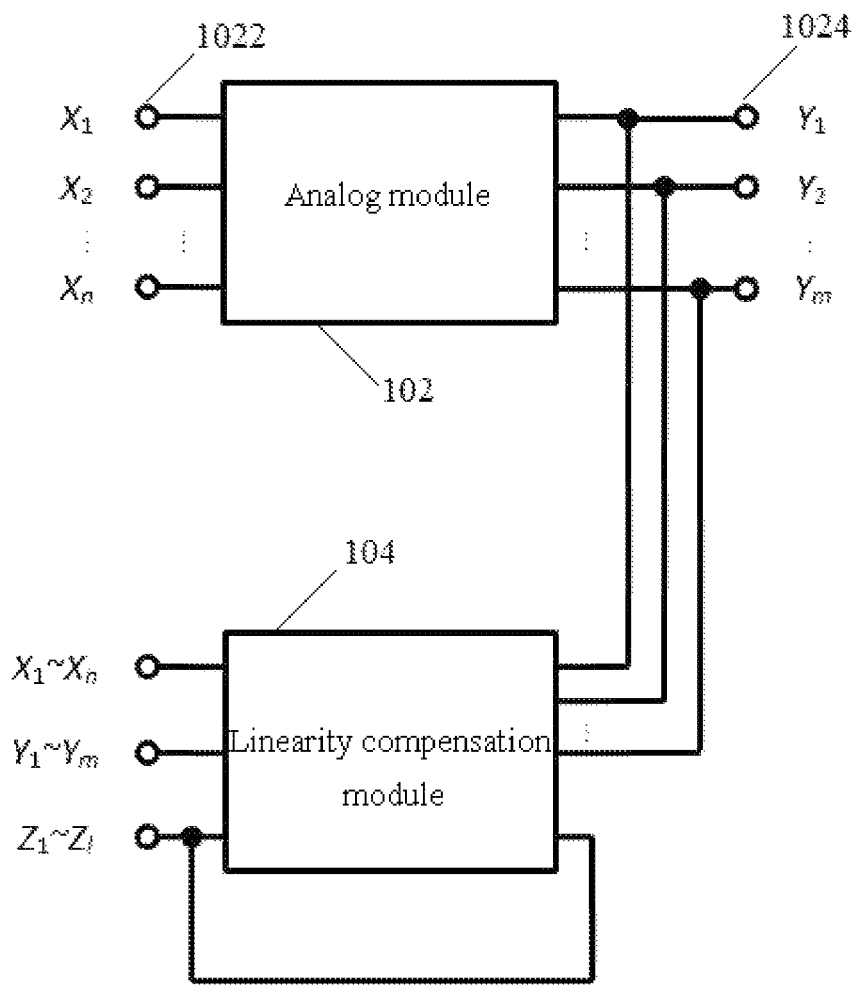
FIG. 1 is a functional diagram (I) of a compensation circuit provided according to an embodiment of the present disclosure.

In this embodiment, a compensation circuit is provided, and FIG. 1 is a functional diagram (I) of the compensation circuit provided according to the embodiment of the present disclosure. As shown in FIG. 1, the compensation circuit includes an analog module 102 and a linearity compensation module 104.

The analog module 102 includes an input node 1022 and an output node 1024. The input node 1022 is configured to receive an input signal, and the output node 1024 is configured to output an output signal.

Figure 3:
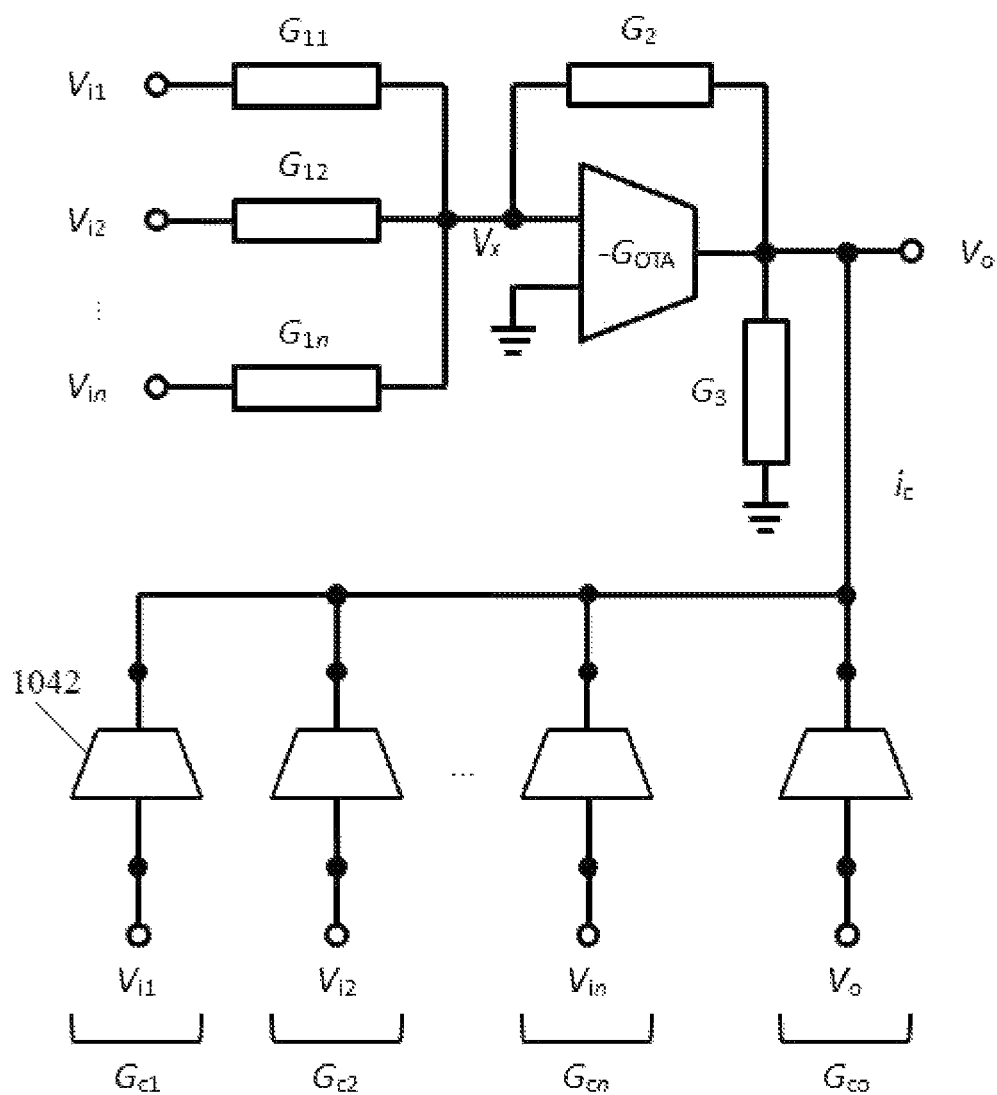
FIG. 3 is a circuit diagram (I) of a linearity compensation module provided according to an embodiment of the present disclosure.

The linearity compensation module 104 includes a plurality of transconductance units 1042 (see FIG. 3). The plurality of transconductance units 1042 are configured to acquire a first configuration signal and configure a combination of the plurality of transconductance units 1042 based on the first configuration signal to provide a compensation signal to the output node 1024, and the first configuration signal is configured to indicate a signal at any position in the analog module 102.

In most cases, there are a plurality of input nodes 1022 and a plurality of output nodes 1024 in the analog module 102. As shown in FIG. 1, the analog module 102 includes a plurality of input nodes 1022 and a plurality of output nodes 1024, and the plurality of input nodes 1022 are configured to receive corresponding input signals $X_1$ to $X_n$ respectively, and the plurality of output nodes 1024 are configured to output corresponding output signals $Y_1$ to $Y_m$ respectively. Accordingly, the first configuration signals acquired in the linearity compensation module 104 are signals at any position in the analog module 102. As shown in FIG. 1, the first configuration signals may indicate the input signals $X_1$ to $X_n$, the output signals $Y_1$ to $Y_m$, or process signals $Z_1$ to $Z_n$ between the input nodes and the output nodes of the analog module 102, or combinations of the input signals $X_1$ to $X_n$, the output signals $Y_1$ to $Y_m$ and the process signals $Z_1$ to $Z_n$, which is not limited herein.

According to the design purpose or function of the above analog module, different electronic devices, such as active RC filters, transimpedance amplifiers and operational transconductance amplifiers (OTA), may be configured or connected between the input nodes and the output nodes to form different broadband analog signal processing circuits. In this embodiment, an OTA-based broadband analog signal processing circuit is taken as an example, i.e., the OTA is disposed between the input nodes and the output nodes in the analog module, where the input nodes provide input signals to the OTA, and the output nodes output an output signal of the OTA.

Figure 2:
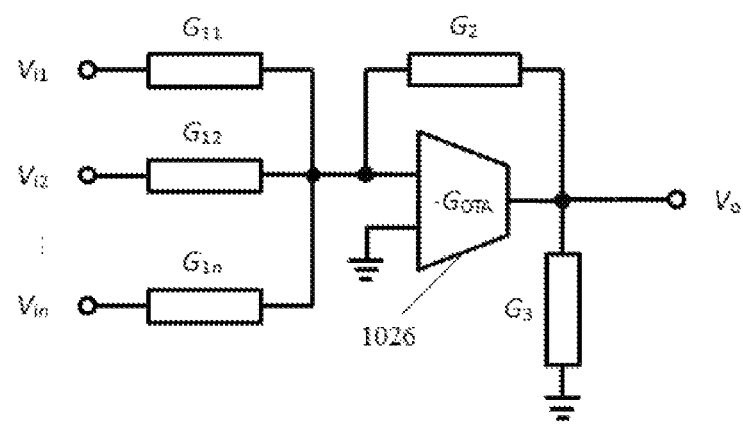
FIG. 2 is a circuit diagram of an analog module provided according to an embodiment of the present disclosure.

FIG. 2 is a circuit diagram of the analog module provided according to the embodiment of the present disclosure. As shown in FIG. 2, the analog module 102 includes a plurality of input nodes providing input signals as voltage signals $V_{i1}$, $V_{i2}$, ..., $V_{in}$, respectively. The above input signals are respectively connected to an input terminal of the OTA 1026 (i.e., $G_{OTA}$ shown in FIG. 2) via loads $G_{I1}$, $G_{I2}$, ..., $G_{In}$ on corresponding branches of the input nodes. After the OTA converts the voltage signals into current signals, an output terminal of the OTA, which constitutes the output node 1024 of the analog module, outputs an output signal $V_o$, and the output signal of the OTA is the output signal output by the output node 1024. At the same time, in the analog module 102, a load $G_2$ is bridged between the input terminal and the output terminal of the OTA, and an output load $G_3$ is further connected between the output terminal of OTA and signal ground. In this embodiment, the OTA is a conventional OTA device in the filed, and those having ordinary skill in the art can know the internal circuit structure of the OTA and the signal processing modes based on the common knowledge in the filed, which will not be repeated herein.

In this embodiment, the first configuration signals acquired by the linearity compensation module 104 are signals at any position in the analog module 102. In FIG. 1, the first configuration signals may indicate the input signals $X_1$ to $X_n$ of the analog module 102, the corresponding output signals $Y_1$ to $Y_m$ respectively output by the plurality of output nodes 1024, and the process signals $Z_1$ to $Z_n$ between the input nodes and the output nodes, or combinations of the input signals $X_1$ to $X_n$ the output signals $Y_1$ to $Y_m$ and the process signals $Z_1$ to $Z_n$, which is not defined herein. Still taking the OTA-based broadband analog signal processing circuit shown in FIG. 2 as an example, the first configuration signals are configured to indicate a signal at any position in the analog module 102 shown in FIG. 2, i.e., the first configuration signals may be input signals $V_{i1}$, $V_{i2}$, ..., $V_{in}$, or the output signal $V_o$, or the process signals at any position between the input nodes and the output nodes, such as signals corresponding to positions of the loads $G_{I1}$, $G_{I2}$, ..., $G_{In}$, or combinations of the input signals, the output signals and the process signals.

FIG. 3 is a circuit diagram (I) of the linearity compensation module provided according to the embodiment of the present disclosure. As shown in FIG. 3, the linearity compensation module 104 includes a plurality of transconductance units 1042 denoted by $G_{c1}$, $G_{c2}$, ..., $G_{cn}$, and $G_{co}$, respectively. The linearity compensation module configures the combinations of the plurality of transconductance units based on different first configuration signals, that is, configures objects and a number of the transconductance units used for compensation in the linearity compensation module, performs transconductance on the input first configuration signals based on the combinations of the different transconductance units to output compensation signals, and provides the compensation signals to the output nodes of the analog module to compensate the output signals. For example, in the linearity compensation module shown in FIG. 3, when only the input signals of the input nodes in the analog module are taken as the first configuration signals, it is only needed to configure the $G_{c1}$, $G_{c2}$, ..., $G_{cn}$ in the plurality of transconductance units accordingly to form combinations to take part in the transconductance on the signals. When only the output signals of the output nodes in the analog module are taken as the first configuration signals, it is only needed to configure the Goo in the plurality of transconductance units accordingly to take part in the transconductance on the signals. In this embodiment, taking the first configuration signals which are a combination of the input signals of the input nodes and the output signals of the output nodes in the linearity compensation module as an example, in the transconductance units, the $G_{c1}$, $G_{c2}$, Gen respectively correspond to the input signals $V_{i1}$, $V_{i2}$, ..., $V_{in}$ connected to the input nodes, and the $G_{co}$ corresponds to the output signal $V_o$ connected to the output node.

In the linearity compensation module, the plurality of transconductance units may use devices of the same size or different sizes. When the devices are of the same size, transconductance on the first configuration signals can be realized by configuring the number of the transconductance units to form corresponding combinations. When the devices are of different sizes, since a transconductance value of the transconductance units differs due to different device sizes of the transconductance units, objects of the transconductance units of corresponding device sizes may be configured for signals of different branches in the first configuration signals to form corresponding combinations in addition to configuring the number of the transconductance units. In order to further improve the applicability of the linearity compensation module to the configuration of the first configuration signals, the linearity compensation module in this embodiment adopts transconductance units of different device sizes to constitute the linearity compensation module, i.e., in the linearity compensation module shown in FIG. 3, the different transconductance units denoted by $G_{c1}$, $G_{c2}$, $G_{cn}$ and $G_{co}$ may have devices of different sizes. That is to say, there are at least two transconductance units of different device sizes in the transconductance units $G_{c1}$, $G_{c2}$, ..., $G_{cn}$ and $G_{co}$, and the plurality of transconductance units may be different from each other in device size, or may be partially different in device size, which is not limited herein.

In order to describe the process of configuring the combinations of the different transconductance units in the linearity compensation module, the method by which the transconductance units compensate and the method by which combinations of the transconductance units are configured will be described below.

In the compensation circuit in this embodiment, there are linear components and nonlinear components in the output signal $V_o$ of the output node in the analog module, and the process of providing the compensation signals to the output signal by the linearity compensation module is a process of compensating the nonlinear components. Generally, the nonlinear components mentioned above are negatively correlated with the swing of the input signal $V_x$ at the input terminal of the OTA, so that a compensation signal for compensating the nonlinear components may be acquired based on the input signal $V_x$ at the input terminal of the OTA. In the circuit diagram of the linearity compensation module shown in FIG. 3, the input signal $V_x$ at the input terminal of the OTA has the following relationship with the input signals and output signal of the analog module:

$$V_x = \frac{\sum_{j=1}^{n} G_{1j}V_{ij} - G_3 V_o \, 'i_c}{G_2 G_3 + \sum_{j=1}^{n} G_2 G_{1j} + \sum_{j=1}^{n} G_3 G_{1j} + G_2 G_{OTA}} \quad \text{Formula I}$$

The above $i_c$ is the compensation signal provided by the linearity compensation module, n is the number of input nodes, $G_{1j}$ is the load $G_{1j}$, $G_2$ and $G_3$ are the loads $G_2$ and $G_3$, respectively, $V_{ij}$ is the input signal $V_{ij}$, $V_o$ is the output signal $V_o$, and $G_{OTA}$ is the transconductance unit of the OTA. In this embodiment, in order to compensate the current, the is further meets:

$$i_c = \Sigma_{j=1}^{n} G_{1j} V_{ij} - G_3 V_o \quad \text{Formula II}$$

The above Formula II may serve as the basis for the linearity compensation module to compensate the linearity, i.e., a compensation current $G_{1j}V_{ij}$ for the input is provided based on the combination of the transconductance units $G_{c1}$, $G_{c2}$, ..., $G_{cn}$ in the linearity compensation module to compensate the nonlinear components corresponding to $V_{i1}$, $V_{i2}$, ..., $V_{in}$ in the input signals, while a compensation current $G_3 V_o$ for the output is provided based on the transconductance unit $G_{co}$ to compensate the nonlinear components corresponding to the output signal $V_o$. In this way, the nonlinear components in the input signals and the output signals in the analog module can be compensated by configuring the linearity compensation module.

After determining the compensation current by the above method, the combination of the transconductance units for configuration may be determined by the following methods in this embodiment:

Enumeration: The possible combinations of the plurality of transconductance units in the linearity compensation module are arranged in sequence, the first configuration signals, i.e., the input signals and the output signals of the analog module, are substituted into each combination of the transconductance units to traverse all combinations, and the compensation signals output by different combinations of the transconductance units are tried in sequence, so as to acquire a corresponding combination of the transconductance units with the optimal linearity compensation effect as the actual configuration of the plurality of transconductance units in the linearity compensation module.

Search: Different configuration signals corresponding to the analog module are tested in advance to acquire the compensation signal corresponding to each configuration signal, and thus the combination of the transconductance units corresponding to the compensation signal is determined. In the actual compensation process of the analog circuit, after acquiring the first configuration signals, the linearity compensation module may determine the combination of transconductance units corresponding to the current configuration signal based on a correspondence relationship between the above configuration signal and the combination of the transconductance units, and perform configuration accordingly.

The above two methods are merely configuration methods for configuring combinations of the plurality of transconductance units by the linearity compensation module in this embodiment, and any method that may configure the combinations of the transconductance units according to the correspondence relationship of compensation currents in this embodiment shall fall into the protection scope of the present disclosure, which is not limited herein.

With the compensation circuit in this embodiment, the linearity compensation module in the compensation circuit can configure the combinations of the plurality of transconductance units based on the acquired first configuration signals to provide the compensation signals to the output nodes in the analog module. Each first configuration signal is configured to indicate a signal at any position in the analog module. Accordingly, the above compensation circuit can solve the problem of large deviations in linearity compensation due to the lack of comprehensive consideration of linearity sources in the linearity compensation process in related technologies, thus improving the linearity reliability.

In this embodiment, on the one hand, the linearity compensation module in the compensation circuit can absorb the input signals and the output signals of the analog module, and supply compensation current for the output signal of the OTA in the analog circuit for compensation, thus reducing the swing of signals at the input terminal of the OTA and improving the linearity of the output signal at the output terminal. Therefore, there is no need to strictly consider the gain and bandwidth of the OTA in the OTA design process of the analog circuit, thus indirectly reducing the performance requirements and cost of the OTA design. On the other hand, since the transconductance units of the linearity compensation module in this embodiment are flexible in size, and the corresponding combinations of the transconductance units can be configured based on different configuration signals in the analog circuit, the linearity compensation module can be applied to analog modules with different bandwidth modes and frequency components, thus significantly improving the reliability of linearity compensation corresponding to the analog modules with different bandwidth modes and frequency components, and allowing the linearity compensation module to be configurable or adaptable.

In an embodiment, each transconductance unit 1042 in the linearity compensation module 104 includes a plurality of transconductance sub-units 10422 connected in parallel to each other. The plurality of transconductance units 1042 and the plurality of transconductance sub-units 10422 are configured to acquire the first configuration signals, and configure combinations of the plurality of transconductance units 1042 and combinations of the plurality of transconductance sub-units 10422 in the transconductance units 1042 based on the first configuration signals to provide the compensation signals to the output nodes 1024.

Figure 4:
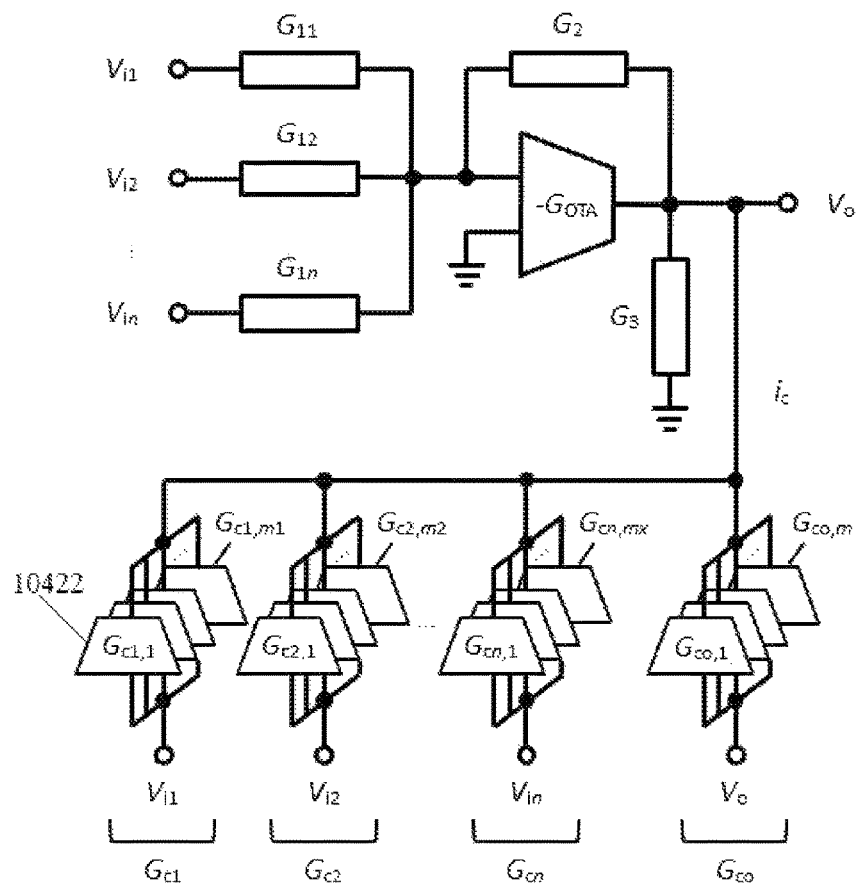
FIG. 4 is a circuit diagram (II) of the linearity compensation module provided according to an embodiment of the present disclosure.

FIG. 4 is a circuit diagram (II) of the linearity compensation module provided according to the embodiment of the present disclosure. As shown in FIG. 4, each transconductance unit 1042 is formed by connecting the plurality of transconductance sub-units 10422 in parallel. Taking the transconductance unit $G_{c1}$ as an example, the transconductance unit $G_{c1}$ includes the plurality of transconductance sub-units $G_{c1,\,1}$, $G_{c1,\,2}$, ..., $G_{c1,\,m1}$ connected in parallel. The linearity compensation module configures the combinations of the plurality of transconductance units and the combinations of the plurality of transconductance sub-units in each transconductance unit based on the first configuration signals, indicating that there are two configuration dimensions in the configuration by the linearity compensation module. The first dimension indicates the configuration of the objects and the number of the transconductance units, and the second dimension indicates the configuration of the objects and the number of the transconductance sub-units in each transconductance unit based on the configuration of the objects and number of the transconductance units in the first dimension. When different objects and the number of the transconductance units and different objects and the number of the transconductance sub-units in each transconductance unit are configured to take part in the transconductance on signals, different transconductance results for signals can be obtained.

Since the plurality of transconductance sub-units in each transconductance unit are connected in parallel, the transconductance value of a transconductance unit can be adjusted by configuring different objects and the number of the transconductance sub-units in the same transconductance unit. Therefore, when the different transconductance units have different device sizes in the above embodiment, the transconductance value of a transconductance unit can also be adjusted by configuring the objects and the number of the transconductance sub-units in each transconductance unit, that is, by configuring the objects and the number of the transconductance sub-units in each transconductance unit based on the first configuration signals.

Accordingly, different transconductance sub-units in the same transconductance unit may adopt devices of the same size or different sizes. When the devices are of the same size, the transconductance on the first configuration signals can be realized by configuring the number of the transconductance sub-units to form corresponding combinations. When the devices are of different sizes, since the transconductance value of the transconductance sub-units differs due to different device sizes of the transconductance sub-units, the objects of the transconductance sub-units of corresponding sizes may be configured for the different first configuration signals to form a corresponding combination based on the configuration of the number of the transconductance sub-units. In order to further improve the applicability of the linearity compensation module to the configuration of the first configuration signals, the plurality of transconductance sub-units in each transconductance unit in the linearity compensation module in this embodiment may adopt devices of different sizes. In the linearity compensation module shown in FIG. 4, by taking the transconductance unit $G_{c1}$ including the plurality of transconductance sub-units $G_{c1, 1}, G_{c1, 2}, \ldots, G_{c1, m1}$ as an example, there are at least two transconductance sub-units of different device sizes in the transconductance unit $G_{c1}$, and the plurality of transconductance sub-units may be different from each other in device size, or may be partially different in device size, which is not limited herein.

Regardless of whether or not the plurality of transconductance sub-units have the same device size, different transconductance units having different transconductance values can be formed by connecting different number of transconductance sub-units in parallel. Therefore, the applicability of the linearity compensation module can be significantly improved by the plurality of configuration dimensions of the linearity compensation module in the above embodiment.

In this embodiment, after the plurality of configuration dimensions for forming different transconductance sub-units are introduced, based on the method by which the transconductance units compensate and the method by which the combinations of the transconductance units are configured, that is, based on configuration of the transconductance units by the linearity compensation module in the above embodiment, the plurality of transconductance sub-units in each transconductance unit are configured again.

In the process of configuring the compensation current, the above Formula II may still serve as the basis for the linearity compensation module to compensate the linearity. On the basis of providing a compensation current $G_{1j} V_{ij}$ for the input based on the combinations of the transconductance units $G_{c1}, G_{c2}, G_{cn}$ and $G_{co}$ in the linearity compensation module to compensate the nonlinear components corresponding to $V_{i1}, V_{i2}, \ldots, V_{in}$ in the input signals, the nonlinear components of the input signals corresponding to the transconductance units can be compensated more effectively by configuring the combinations of the plurality of transconductance sub-units in each transconductance unit. For example, a corresponding combination of the plurality of transconductance sub-units $G_{c1, 1}, G_{c1, 2}, \ldots, G_{c1, m1}$ in the transconductance unit $G_{c1}$ can be determined according to a value of the input signal $V_{i1}$, so that the transconductance unit $G_{c1}$ can form a corresponding transconductance value according to the combination to compensate the input signal $V_{i1}$. By analogy, each of the transconductance units $G_{c1}, G_{c2}, \ldots, G_{cn}$ and $G_{co}$ may perform compensation by configuring the combinations of the transconductance sub-units therein.

Accordingly, after determining the compensation current, the above methods in this embodiment may still be adopted to determine the combination of the transconductance units for configuration, for example:

Enumeration: The possible combinations of the plurality of transconductance units in the linearity compensation module and the plurality of transconductance sub-units in each transconductance unit are arranged in sequence, the first configuration signals, i.e., the input signals and the output signals of the analog module, are substituted into each combination to traverse all combinations, and the compensation signals output by different combinations are tried in sequence, so as to acquire a corresponding combination with the optimal linearity compensation effect as the actual configuration of the plurality of transconductance units and the plurality of transconductance sub-units in each transconductance unit in the linearity compensation module.

Search: Different configuration signals corresponding to the analog module are tested in advance to acquire the compensation signal corresponding to each configuration signal, and thus the combination of the transconductance units and the combination of the plurality of transconductance sub-units in each transconductance unit corresponding to the compensation signal are determined. In the actual compensation process of the analog circuit, after acquiring the first configuration signals, the linearity compensation module can determine the combination of transconductance units and the combination of the plurality of transconductance sub-units in each transconductance unit corresponding to the current configuration signal based on the correspondence relationship between the configuration signals and the plurality of combinations, and perform configuration accordingly.

With the composition of the transconductance unit in the above embodiment, the applicability of the linearity compensation module to the configuration can be improved due to the plurality of configuration dimensions during configuration based on the first configuration signals, so that the effectiveness and reliability of the linearity compensation module for linearity compensation corresponding to different analog modules can be significantly improved.

In an embodiment, each transconductance sub-unit 10422 includes a transconductance transistor 108 and a bias transistor 110. A gate of the transconductance transistor 108 is configured to acquire the first configuration signals, and a drain of the transconductance transistor 108 is configured to provide signals to a source of the bias transistor 110. A gate of the bias transistor 110 is configured to acquire bias signals, and a drain of the bias transistor 110 is configured to provide compensation signals.

Both the transconductance transistor 108 and the bias transistor 110 are PMOS transistors or NOMS transistors.

Figure 5:
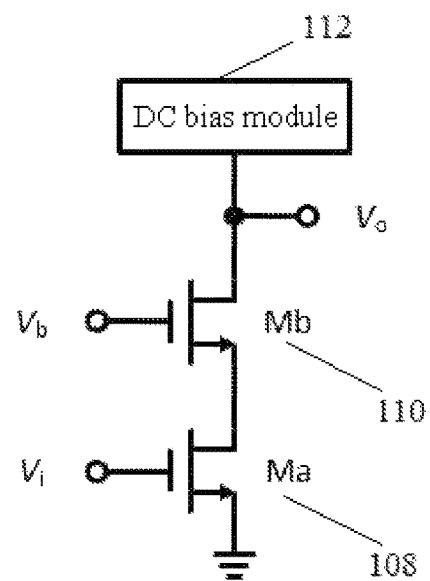
FIG. 5 is an internal structural diagram (I) of a cascode transconductance sub-unit provided according to an embodiment of the present disclosure.
Figure 6:
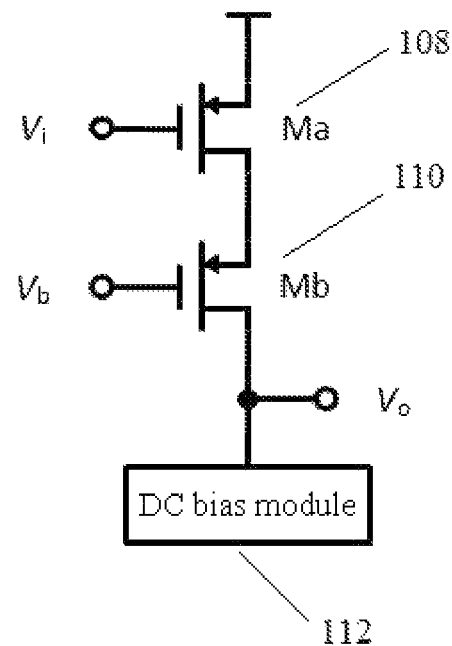
FIG. 6 is an internal structural diagram (II) of a cascode transconductance sub-unit provided according to an embodiment of the present disclosure.

The transconductance transistor and the bias transistor constitute a cascode transconductance sub-unit. FIG. 5 is an internal structural diagram (I) of the cascode transconductance sub-unit provided according to the embodiment of the present disclosure. As shown in FIG. 5, both the transconductance transistor Ma and the bias transistor Mb are NMOS transistors, and a gate of the transconductance transistor Ma serves as an input terminal of the transconductance sub-unit to acquire the first configuration signals. In FIG. 5, $V_i$ represents the first configuration signals, and a drain of the transconductance transistor Ma is configured to provide signals to a source of the bias transistor Mb, and a source of the transconductance transistor Ma is configured to acquire a GND signal. A gate of the bias transistor Mb is configured to acquire the bias signal $V_b$, and a drain of the bias transistor Mb is configured to provide compensation signals. The bias signal $V_b$ acquired by the gate of the bias transistor Mb may be provided by a DC bias module 112. The DC bias module may be provided by the analog module, i.e., the process signal in the analog module may be provided as a bias signal to the bias transistor, or the DC bias module may be provided independently, i.e., a separate circuit module is provided for the bias signal of the bias transistor, which is not limited herein. FIG. 6 is an internal structural diagram (II) of the cascode transconductance sub-unit provided according to the embodiment of the present disclosure. As shown in FIG. 6, both the transconductance transistor Ma and the bias transistor Mb are PMOS transistors. In this case, the transconductance transistor Ma and the bias transistor Mb are connected in the same way as in the case where the transconductance transistor Ma and the bias transistor Mb are NMOS transistors, which will not be repeated herein.

In order to describe operating modes of the cascode transconductance sub-unit, the operating principle of the cascode transconductance sub-unit will be described below.

In the cascode transconductance sub-unit shown in FIG. 5 or FIG. 6, the transconductance transistor Ma operates in a linear region, and the bias transistor Mb operates in a saturation region. The transconductance of the transconductance transistor is approximately linear with a drain-source voltage of the transconductance transistor, i.e., $g_m \approx K V_{DS}$, where $g_m$ is the transconductance of the transconductance transistor Ma, $V_{DS}$ is the drain-source voltage of the transconductance transistor Ma, and K is the process and size parameter of the transconductance transistor Ma. Therefore, it may be known that the drain-source voltage and transconductance of the transconductance transistor may vary correspondingly by connecting the bias signal (bias voltage) $V_b$ to the gate of the bias transistor on the premise that the size of the transconductance transistor and the bias transistor remain unchanged, so as to generate the corresponding compensation current. In this embodiment, the bias voltage $V_b$ may be either an adjustable voltage or a fixed voltage, and the size of the transconductance transistor and the bias transistor may be predetermined according to the actual state of the analog circuit, or may be designed to be adjustable.

In an embodiment, each transconductance sub-unit includes an input terminal, an output terminal, and current mirrors 114 disposed between the input terminal and the output terminal. The output terminal is configured to provide the compensation signals.

The input terminal includes a PMOS transistor 116 and an NMOS transistor 118. A source of the PMOS transistor 116 and a source of the NMOS transistor 118 are connected and configured to acquire the first configuration signals, a gate of the PMOS transistor 116 is configured to acquire a first bias signal, a gate of the NMOS transistor 118 is configured to acquire a second bias signal, and a drain of the PMOS transistor 116 and a drain of the NMOS transistor 118 are configured to provide signals to the current mirrors 114.

Figure 7:
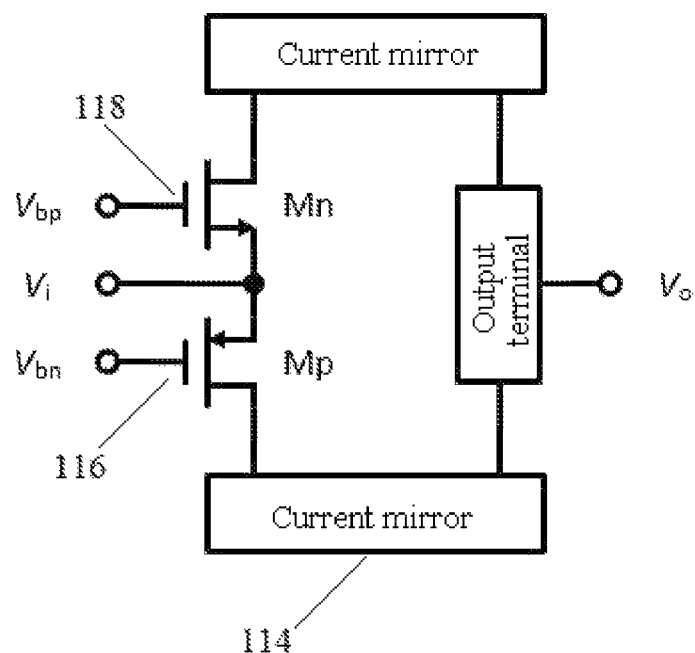
FIG. 7 is an internal structural diagram of a common-gate transconductance sub-unit provided according to an embodiment of the present disclosure.

The transconductance transistor and the bias transistor constitute a common-gate transconductance sub-unit. FIG. 7 is an internal structural diagram of the common-gate transconductance sub-unit provided according to the embodiment of the present disclosure. As shown in FIG. 7, an input terminal of the common-gate transconductance sub-unit includes two input transistors Mp and Mn. The input transistor Mp is a PMOS transistor, the input transistor Mn is an NMOS transistor, and a source of the input transistor Mp is connected to a source of the input transistor Mn and configured to receive the input signals, namely the first configuration signals in this embodiment. A gate of the input transistor Mp and a gate the input transistor Mn are respectively configured to receive the bias signals. The gate of the input transistor Mp is configured to acquire a first bias signal $V_{bn}$ and the gate of the input transistor Mn is configured to acquire a second bias signal $V_{bp}$, and a drain of the input transistor Mp and a drain of the input transistor Mn are respectively connected to the corresponding current mirror modules to output signals through the current mirror modules.

In order to further describe operating modes of the above common-gate transconductance sub-unit, the operating principle of the common-gate transconductance sub-unit will be further described below.

Taking the input transistor Mn as an example, the transconductance of Mn is linear with the second bias voltage $V_{bp}$ connected to the gate-source, namely $g_m \approx K(V_{GS} - V_{TH})$, where K is the process and size parameter of an MOS transistor, $V_{GS}$ is the gate-source voltage of the MOS transistor, and $V_{TH}$ is the threshold voltage of the MOS transistor. When there is a change in the input signal, i.e., the voltage connected to the source of Mn, the $V_{GS}$ will also change, so that the transconductance of Mn and the compensation current provided by the drain will change accordingly, and the compensation current may be output after being mirrored to the output terminal by each current mirror. In this embodiment, the size of the input transistor Mn and the input transistor Mp, namely the K, may be predetermined according to the actual state of the analog circuit, or may be designed to be adjustable to enhance the ability to control the compensation current.

In an embodiment, the first configuration signals include input signals, output signals, and process signals at any position between the input nodes and the output nodes in the analog module.

The first configuration signals may also be combinations of the input signals, output signals and process signals. In this embodiment, the input signals and output signals are used as the first configuration signals for illustration, which will not be repeated herein.

In an embodiment, when the first configuration signals are the input signals, the plurality of transconductance units are configured in such a way that each transconductance unit acquires the input signals from one input node.

The transconductance units may correspond to the first configuration signals in number, so as to ensure that the transconductance units can compensate the nonlinear components in each input signal.

Embodiment Two

In this embodiment, a compensation chip is further provided, including the compensation circuit in Embodiment one and the embodiments corresponding to Embodiment one. The technical scheme of the compensation circuit in the compensation chip in this embodiment corresponds to the compensation circuit in Embodiment one, which will not be repeated herein.

Embodiment Three

In this embodiment, a compensation method for providing compensation signals to an analog module is further provided. The analog module includes a plurality of input nodes and a plurality of output nodes. FIG. 8 is a flowchart (I) of the compensation method provided according to the embodiment of the present disclosure. As shown in FIG. 8, the compensation method includes a step of S302.

At step S302, the linearity compensation module acquires a plurality of first configuration signals, and configures combinations of a plurality of transconductance units based on the first configuration signals to provide compensation signals to the output nodes. Each first configuration signal is configured to indicate a signal at any position in the analog module.

With the compensation method in this embodiment, the combinations of the plurality of transconductance units can be configured based on the acquired first configuration signals to provide the compensation signals to the output nodes in the analog module. Each first configuration signal is configured to indicate a signal at any position in the analog module. Therefore, the above compensation method can solve the problem of large deviations in linearity compensation due to the lack of comprehensive consideration of nonlinearity sources and influencing factors in the linearity compensation process in related technologies, thus improving the reliability of the linearity compensation technology.

Other technical schemes of the compensation method in this embodiment correspond to the technical schemes of the compensation circuit in Embodiment one and the embodiments corresponding to Embodiment one, which will not be repeated herein.

Through the description of the above embodiments, those having ordinary skill in the art can understand that the method in the above embodiments may be implemented by software and a general hardware platform, and of course may also be implemented by hardware. It is understood that the technical schemes of the present disclosure may be embodied in the form of a software product stored in a storage medium (such as read-only memory/random access memory (ROM/RAM), magnetic disk, and optical disk) and includes a plurality of instructions to enable a terminal device (which may be a mobile phone, a computer, a server, or a network device) to implement the method described in the embodiments of the present disclosure.

Embodiment Four

In this the embodiment, a compensation circuit is further provided. FIG. 9 is a functional diagram (II) of the compensation circuit provided according to the embodiment of the present disclosure. As shown in FIG. 9, the compensation circuit includes an analog module 402 including an input node 4022 and an output node 4024. The input node is configured to receive an input signal and the output node is configured to output an output signal; a detection module 404 configured to detect operating information of the analog module 402 and provide a second configuration signal based on the operating information; and a linearity compensation module 406 configured to acquire a first configuration signal and the second configuration signal, and provide a compensation signal to the output node based on the first configuration signal and/or second configuration signal. The first configuration signal is configured to indicate a signal at any position in the analog module.

In the analog module 402, there are a plurality of input nodes 4022 and output nodes 4024 in most cases. As shown in FIG. 9, the analog module 402 is provided with a plurality of input nodes 4022 and a plurality of output nodes 4024, and the plurality of input nodes 4022 are configured to receive corresponding input signals $X_1$ to $X_n$ respectively, and the plurality of output nodes 4024 are configured to output corresponding output signals $Y_1$ to $Y_m$ respectively. According to the design purpose or function of the above analog module, different electronic devices, such as active RC filters, transimpedance amplifiers and operational transconductance amplifiers (OTA), may be configured or connected between the input nodes and the output nodes to form different broadband analog signal processing circuits, which is not be limited in the present disclosure. In this embodiment, an OTA-based broadband analog signal processing circuit is taken as an example, that is, the OTA is disposed between input nodes and output nodes in an analog module, where the input nodes provide input signals to the OTA, and the output node outputs an output signal of the OTA.

The detection module 404 is configured to detect the operating information of the analog module 402. In an embodiment, the operating information of the analog module 402 includes one of process information, voltage information, temperature information and frequency information. The process information indicates process angle information of an MOS transistor of the compensation circuit in this embodiment, the voltage information indicates supply voltage information of the compensation circuit in this embodiment, the temperature information indicates operating temperature or ambient temperature information of the compensation circuit in this embodiment, and the frequency information indicates frequency component information of the compensation circuit in this embodiment. The above detection module may be an integral module or a plurality of detection units provided independently, such as a voltage sensor for detecting the supply voltage information of the compensation circuit, and a temperature sensor for detecting the operating temperature or the ambient temperature of the compensation circuit. The type of the above detection module is not limited herein, and any device type or structure layout capable of detecting the corresponding information in the analog circuit can serve as the detection module.

The detection module 404 acquires and processes the above operating information, e.g., encodes and encapsulates the acquired operating information to acquire corresponding second configuration signals. When the operating information in the above embodiment includes one of the process information, the voltage information, the temperature information and the frequency information, the process information may generate process configuration signals accordingly, the voltage information may generate voltage configuration signals accordingly, the temperature information may generate temperature configuration signals accordingly, and the frequency information may generate frequency configuration signals accordingly. The detection module may acquire the second configuration signals and provide the signals to the linearity compensation module. As shown in FIG. 9, the detection module acquires the process information $U_{pi}$, the voltage information $U_{vi}$, the temperature information $U_{ti}$ and the frequency information $U_{fi}$ of the analog module, and generates a process configuration signal $U_{po}$, a voltage configuration signals $U_{vo}$, a temperature configuration signal $U_{to}$ and a frequency configuration signal $U_{fo}$ accordingly, which are collectively sent to the linearity compensation module as the second configuration signals.

The linearity compensation module 406 can acquire the second configuration signals provided by the detection module 404 as well as the first configuration signals provided by the analog module 402. The first configuration signals acquired by the linearity compensation module are signals at any position in the analog module 402. As shown in FIG. 9, the first configuration signals may indicate the input signals $X_1$ to $X_n$ of the analog module, the output signals $Y_1$ to $Y_m$, and the process signals $Z_1$ to $Z_n$ between the input nodes and the output nodes, or combinations of the input signals $X_1$ to $X_n$, the output signals $Y_1$ to $Y_m$ and the process signals $Z_1$ to $Z_n$, which is not limited herein. The linearity compensation module acquires the first configuration signals and the second configuration signals, i.e., it may acquire compensation signals based on these configuration signals and provide the compensation signals to the output nodes of the analog module.

The operating information of the analog module, such as process information and temperature information, will only be generated after the analog module is put into operation, and will vary with the operating environment of the analog module. As a result, when the analog module just starts to operate, the operating information is often undetected or the detected operating information is inaccurate. In this case, the linearity compensation module can acquire compensation signals only based on the first configuration signals. When the analog module is in a stable operating state, the linearity compensation module can acquire compensation signals based on the first configuration signals and the second configuration signals. Meanwhile, the linearity compensation module may perform independent linearity compensation only based on the operating information of the analog module, i.e., the compensation signals may be acquired only based on the second configuration signals.

In order to illustrate the process of acquiring the compensation signals by the linearity compensation module based on the first and/or second configuration signals, the method of acquiring the compensation signals will be described below.

Enumeration: The first and/or second configuration signals are substituted into the linearity compensation module, the compensation signals corresponding to the first and/or second configuration signals are calculated by all possible compensation methods in the linearity compensation module, and the compensation signal with the optimal compensation effect is used as the actual compensation signal to compensate the linearity of the analog module.

Search: Different input/output/process signals corresponding to the analog module are tested in advance to acquire the compensation signal corresponding to each first configuration signal, while different operating information corresponding to the analog module is tested in advance to acquire the compensation signal corresponding to each second configuration signal, and the compensation modes of the linearity compensation module corresponding to the above different compensation signals are determined, respectively. In the actual compensation process of the analog module, after acquiring the first and/or second configuration signals, the linearity compensation module may determine the compensation mode of the linearity compensation module corresponding to the current first and/or second configuration signal and the compensation signal provided thereby according to the correspondence relationship between the first and/or second configuration signals, so as to compensate the linearity of the analog module.

The above two methods are merely embodiments in this embodiment by which the linearity compensation module acquires the compensation signals based on the first and/or second configuration signals, and other methods by which the compensation signals are acquired may also be adopted by the linearity compensation module, which is not limited herein.

With the compensation circuit in this embodiment, the detection module can detect the operating information of the analog module and provide the second configuration signals based on the operating information, so that the linearity compensation module acquires the compensation signals based on the second configuration signals and the first configuration signals provided by the analog module and provides the compensation signals to the output nodes of the analog module for linearity compensation. Accordingly, the above compensation circuit can solve the problem of large deviations in linearity compensation due to the lack of comprehensive consideration of nonlinearity sources and influencing factors in the linearity compensation process in related technologies, thus improving the reliability of the linearity compensation technology.

In the compensation circuit of this embodiment, since the second configuration signals acquired based on the operating information of the analog module serve as one of the bases for the linearity compensation module to perform compensation, the compensation signals provided by the linearity compensation module can effectively compensate the nonlinear factors formed by the analog module based on the operating information of the analog module. Therefore, the compensation circuit in this embodiment can effectively compensate the linearity according to the process characteristics of the analog module, so as to further improve the reliability of linearity compensation.

In an embodiment, the linearity compensation module 406 is configured to acquire the first and/or second configuration signals in an $m^{th}$ cycle and provide an $m^{th}$ compensation signal based on the first and/or second configuration signals; to acquire the first and second configuration signals in an $(m+1)^{th}$ cycle, and provide an $(m+1)^{th}$ compensation signal based on the first and second configuration signals; and to provide the $m^{th}$ compensation signal to the output node when a difference in value between the $(m+1)^{th}$ compensation signal and the $m^{th}$ compensation signal is within a predetermined range.

The m is an integer, and the assignment of m only represents a certain operating cycle of the analog module, i.e., the technical scheme in the above embodiment may be adopted for any operating cycle of the analog module; m+1 represents a next cycle after the $m^{th}$ cycle. For example, when the $m^{th}$ cycle is the $0^{th}$ cycle, the $(m+1)^{th}$ cycle is the $1^{st}$ cycle. The assignment of m is not limited in this embodiment, i.e., when the $m^{th}$ cycle is the $0^{th}$ cycle and the $(m+1)^{th}$ cycle is the $1^{st}$ cycle, m may be assigned as 1 again, i.e., the $m^{th}$ cycle is the $1^{st}$ cycle and the $(m+1)^{th}$ cycle is the $2^{nd}$ cycle, indicating that the technical scheme in this embodiment can be implemented cyclically according to the operating cycle of the analog module.

The case with m as 0 is described below.

In the $0^{th}$ cycle, namely the initial operating stage of the analog module, the linearity compensation module acquires the input signals or output signals in the analog module as the first configuration signals, and calculates the compensation signal based on the first configuration signals. The compensation signal is calculated as described in the above embodiment and will not be repeated herein. In this case, the compensation signal provided serves as the $0^{th}$ compensation signal, which is an initial value of the compensation signal provided by the linearity compensation module.

In the $1^{st}$ cycle in which the analog module is already in a stable operating state, the detection module may detect the operating information of the analog module, such as process information, voltage information, temperature information, and frequency information, obtain, by coding and encapsulating the operating information of the analog module, corresponding second configuration signals, such as process configuration signals, voltage configuration signals, temperature configuration signals and frequency configuration signals, and provide the second configuration signals to the linearity compensation module. The linearity compensation module recalculates the compensation signal based on the first configuration signals provided by the analog module in the $1^{st}$ cycle and the second configuration signals. In this case, the compensation signal serves as the first compensation signal.

On the premise that a first compensation signal is acquired, the first compensation signal may be compared with the $0^{th}$ compensation signal to determine whether the difference in value between the first compensation signal and the $0^{th}$ compensation signal is within the predetermined range. The difference in value between the first compensation signal and the $0^{th}$ compensation signal may be understood as an error between the compensation signals provided by the linearity compensation module in the $1^{st}$ cycle and the $0^{th}$ cycle. When the difference in value between the first compensation signal and the $0^{th}$ compensation signal is within the predetermined range, the error is acceptable, and the impact of the operating information of the analog module on the linearity of the analog module in the $1^{st}$ cycle is within a controllable range compared with that in the $0^{th}$ cycle. Therefore, the $0^{th}$ compensation signal provided by the linearity compensation module in the $0^{th}$ cycle may serve as a steady-state compensation signal, so that the analog module can be effectively compensated for linearity based on the $0^{th}$ compensation signal.

Conversely, when the difference in value between the first compensation signal and the $0^{th}$ compensation signal is beyond the predetermined range, the operating information of the analog module has a greater impact on the formation of linearity of the analog module in the $1^{st}$ cycle. If the linearity of the output signal of the analog module is still compensated with the $0^{th}$ compensation signal, effective linearity compensation cannot be realized, and there is a need to provide the compensation signal again.

In this case, m may be assigned as 1, and the above process may be repeated with the $m^{th}$ cycle as the $1^{st}$ cycle. In the case where the linearity compensation module has acquired the first compensation signal in the $1^{st}$ cycle, the detection module detects the operating information of the analog module again in the $(m+1)^{th}$ cycle, namely a $2^{nd}$ cycle, and acquires a new second configuration signal based on the operating information detected again, to provide to the linearity compensation module.

In the $2^{nd}$ cycle, the linearity compensation module recalculates the compensation signal based on the first and second configuration signals in the current cycle, and takes the compensation signal as the second compensation signal. Similarly, on the premise that the second compensation signal is acquired, the second compensation signal may be compared with the first compensation signal to determine whether the difference in value between the second compensation signal and the first compensation signal is within the predetermined range. When the difference in value between the second compensation signal and the first compensation signal is within the predetermined range, the impact of the operating information of the analog module on the linearity of the analog module in the $2^{nd}$ cycle is within the controllable range compared with that in the $1^{st}$ cycle. Therefore, the first compensation signal provided by the linearity compensation module in the $1^{st}$ cycle may serve as a steady-state compensation signal, so that the analog module can be effectively compensated for linearity based on the first compensation signal.

Accordingly, when the difference in value between the second compensation signal and the first compensation signal in the $2^{nd}$ cycle is still beyond the predetermined range, m is re-assigned as 3, a third compensation signal calculated in a $3^{rd}$ cycle is compared with the second compensation signal, and the above process is repeated. By analogy, when the difference in value between a $(m+1)^{th}$ compensation signal and a $m^{th}$ compensation signal is within the predetermined range, the linearity compensation module may provide the $m^{th}$ compensation signal to the output nodes of the analog module for linearity compensation. The above process may be referred to as an iterative process of the linearity compensation module, through which the compensation signals provided by the linearity compensation module to the output nodes of the analog module can effectively and reliably compensate the linearity of the analog module in the current cycle.

In the above technical scheme, on the basis that the operating information of the analog module is introduced to provide the compensation signals in this embodiment, the compensation signal can be ensured to provide effective linearity compensation in the current cycle, thus further improving the reliability of linearity compensation of the analog module.

In an embodiment, the detection module 404 is configured to, when a change in the operating information of the analog module is detected in an $n^{th}$ cycle, provide the second configuration signal to the linearity compensation module again based on the changed operating information. The linearity compensation module 406 is configured to acquire the first configuration signals and the second configuration signals in the $n^{th}$ cycle and provide an $n^{th}$ compensation signal based on the first and second configuration signals; and to acquire the first and second configuration signals in an $(n+1)^{th}$ cycle, and provide an $(n+1)^{th}$ compensation signal based on the first and second configuration signals. The linearity compensation module is configured to provide the $n^{th}$ compensation signal to the output node when the difference in value between the $(n+1)^{th}$ compensation signal and the $n^{th}$ compensation signal is within a predetermined range.

The n is an integer, and the assignment of n only represents an operating cycle of the analog module, i.e., the technical scheme in the above embodiment may be adopted for any operating cycle of the analog module; n+1 represents a next cycle after the $n^{th}$ cycle. For example, when the $n^{th}$ cycle is the $2^{nd}$ cycle, the $(n+1)^{th}$ cycle is the $3^{rd}$ cycle. The assignment of n is not limited in this embodiment, i.e., when the $n^{th}$ cycle is the $2^{nd}$ cycle and the $(n+1)^{th}$ cycle is the $3^{rd}$ cycle, n may be assigned as 3 again, i.e., the $n^{th}$ cycle is the $1^{st}$ cycle and the $(n+1)^{th}$ cycle is a $4^{th}$ cycle, indicating that the technical scheme in this embodiment can be implemented cyclically according to the operating cycle of the analog module.

The case with n as 5 is described below.

In a $5^{th}$ cycle, after detecting a change in the operating information of the analog module, the detection module acquires the second configuration signal again based on the changed operating information and provides the second configuration signal to the linearity detection module. After acquiring the second configuration signal reacquired based on the changed operating signal in the $5^{th}$ cycle, the linearity detection module re-calculates the compensation signal in the $5^{th}$ cycle based on the first and second configuration signals in the current cycle. The compensation signal is calculated as described in the above embodiment and will not be repeated herein. In this case, the compensation signal calculated serves as a fifth compensation signal, which is an initial value of the compensation signal provided by the linearity compensation module after the operating information of the analog module changes.

In a $6^{th}$ cycle in which the analog module is already in a stable operating state again after the operating information changes, the detection module may acquire the second configuration signal based on the operating information of the corresponding analog module in the $6^{th}$ cycle and provide the second configuration signal to the linearity detection module. The linearity detection module re-calculates the compensation signal based on the first configuration signal of the analog module in the $6^{th}$ cycle together with the above second configuration signal. In this case, the compensation signal serves as a sixth compensation signal.

On the premise that the sixth compensation signal is acquired, the sixth compensation signal may be compared with the fifth compensation signal to determine whether the difference in value between the sixth compensation signal and the fifth compensation signal is within the predetermined range. The difference in value between the sixth compensation signal and the fifth compensation signal may be understood as an error between the compensation signals provided by the linearity compensation module in the $6^{th}$ cycle and the $5^{th}$ cycle. When the difference in value between the sixth compensation signal and the fifth compensation signal is within the predetermined range, the error is acceptable, and the impact of the operating information of the analog module on the linearity of the analog module in the $6^{th}$ cycle is within the controllable range compared with that in the $5^{th}$ cycle. Therefore, the fifth compensation signal provided by the linearity compensation module in the $5^{th}$ cycle may serve as a steady-state compensation signal, so that the analog module can be effectively compensated for linearity based on the fifth compensation signal.

Conversely, when the difference in value between the sixth compensation signal and the fifth compensation signal is beyond the predetermined range, the change in the operating information of the analog module has a greater impact on the formation of linearity of the analog module in the $6^{th}$ cycle. If the linearity of the output signal of the analog module is still compensated with the fifth compensation signal, effective linearity compensation cannot be realized, and there is a need to provide the compensation signal again.

In this case, n may be assigned as 6, and the above process may be repeated with the $n^{th}$ cycle as the $6^{th}$ cycle. In the case where the linearity compensation module has acquired the sixth compensation signal in the $6^{th}$ cycle, the detection module detects the operating information of the analog module again in a (n+1)th cycle, namely a $7^{th}$ cycle, and acquires a new second configuration signal based on the operating information detected again, to provide to the linearity compensation module.

In the $7^{th}$ cycle, the linearity compensation module re-calculates the compensation signal based on the first and second configuration signals in the current cycle, and takes the compensation signal as a seventh compensation signal. Similarly, on the premise that the seventh compensation signal is acquired, the seventh compensation signal may be compared with the sixth compensation signal to determine whether the difference in value between the seventh compensation signal and the sixth compensation signal is within the predetermined range. When the difference in value between the seventh compensation signal and the sixth compensation signal is within the predetermined range, the impact of the operating signal of the analog module on the linearity of the analog module in the $7^{th}$ cycle is within the controllable range compared with that in the $6^{th}$ cycle. Therefore, the sixth compensation signal provided by the linearity compensation module in the $6^{th}$ cycle may serve as a steady-state compensation signal, so that the analog module can be effectively compensated for linearity based on the sixth compensation signal.

Accordingly, when the difference in value between the seventh compensation signal and the sixth compensation signal in the $7^{th}$ cycle is still beyond the predetermined range, n is re-assigned as 8, an eighth compensation signal calculated in a $8^{th}$ cycle is compared with the seventh compensation signal, and the above process is repeated. By analogy, when the difference in value between a $(n+1)^{th}$ compensation signal and a $n^{th}$ compensation signal is within the predetermined range, the linearity compensation module may provide the $n^{th}$ compensation signal to the output nodes of the analog module for linearity compensation.

According to the technical scheme, in addition to effectively compensating the linearity in the current cycle of the analog module through iteration, the linearity compensation module can adjust the corresponding compensation signal every time when there is a change in the corresponding operating information of the analog module, so that the compensation signal provided by the linearity compensation module to the output node of the analog module can more reliably compensate the linearity of the analog module after the operating information changes, thereby ensuring that the linearity compensation effect is not diminished due to parameter fluctuation and mode change.

In an embodiment, the linearity compensation module 406 includes a plurality of transconductance units 4062. The plurality of transconductance units 4062 are configured to acquire the first configuration signals and the second configuration signals, and configure combinations of the plurality of transconductance units 4062 based on the first and/or second configuration signals to provide compensation signals to the output nodes.

Figure 10:
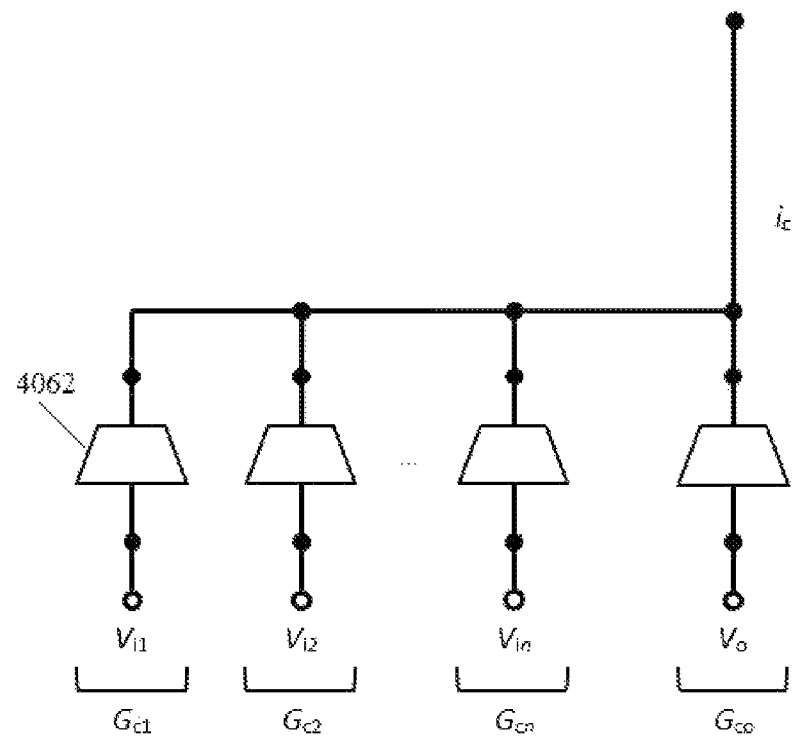
FIG. 10 is a circuit diagram (III) of a linearity compensation module provided according to an embodiment of the present disclosure.

FIG. 10 is a circuit diagram (III) of the linearity compensation module provided according to the embodiment of the present disclosure. As shown in FIG. 10, the linearity compensation module in the above embodiment includes a plurality of transconductance units 4062 denoted by $G_{c1}$, $G_{c2}$, ..., $G_{cn}$, and $G_{co}$, respectively. The linearity compensation module configures the combinations of the plurality of transconductance units based on the different first and second configuration signals, i.e., configures objects and a number of the transconductance units used for compensation in the linearity compensation module, performs transconductance on the input first and/or second configuration signals through the combination of the different transconductance units to output compensation signals, and provides the compensation signals to the output nodes of the analog module to compensate the output signals.

For example, in the linearity compensation module shown in FIG. 10, input signals $X_1$ to $X_n$, output signals $Y_1$ to $Y_m$, and process signals $Z_1$ to $Z_n$ or their combinations in the compensation circuit shown in FIG. 9 may serve as first the configuration signals, and a process configuration signal $U_{po}$, a voltage configuration signal $U_{vo}$, a temperature configuration signal $U_{to}$, a frequency configuration signal $U_{fo}$ or combinations thereof may serve as the second configuration signals and sent to the different transconductance units in the linearity compensation module. For example, the input signals $X_1$ to $X_n$ may be input into the $G_{c1}$, $G_{c2}$, ..., $G_{cn}$ of the plurality of transconductance units as the first configuration signals to compensate the nonlinear components in the first configuration signals, and the process configuration signal $P_o$ may be input into the $G_{co}$ of the plurality of transconductance units as the second configuration signal to compensate the nonlinear components in the second configuration signal, i.e., the $G_{c1}$, $G_{c2}$, ..., $G_{cn}$ and $G_{co}$ in the plurality of transconductance units are configured based on the actual type of the first and second configuration signals to form combinations to take part in the transconductance on the first and second configuration signals, and calculate the compensation signals according to the $G_{c1}$, $G_{c2}$, ..., $G_{cn}$ and $G_{co}$ in the plurality of transconductance units, so as to provide the compensation signals to compensate the output signals of the analog module.

In the linearity compensation module, the plurality of transconductance units may use devices of the same size or different sizes. When the devices are of the same size, transconductance on the first and/or second configuration signals can be realized by configuring the number of the transconductance units to form corresponding combinations. When the devices are of different sizes, since a transconductance value of the transconductance units differs due to different device sizes of the transconductance units, objects of the transconductance units of corresponding sizes may be configured for different signals in the first and/or second configuration signals to form corresponding combinations in addition to configuring the number of the transconductance units. In order to further improve the applicability of the linearity compensation module to the configuration of the first and/or second configuration signals, the linearity compensation module in this embodiment adopts transconductance units of different device sizes to constitute the linearity compensation module, i.e., in the linearity compensation module shown in FIG. 10, the different transconductance units $G_{c1}$, $G_{c2}$, ..., $G_{cn}$ and $G_{co}$ may have devices of different sizes. That is to say, there are at least two transconductance units of different device sizes in the transconductance units $G_{c1}$, $G_{c2}$, ..., $G_{cn}$ and $G_{co}$, and the plurality of transconductance units may be different from each other in device size, or may be partially different in device size, which is not limited herein.

In this embodiment, as for the process of calculating the compensation signals by the linearity compensation module, reference may be made to the compensation of the nonlinearity of the input signals in the OTA-based broadband analog signal processing circuit in Embodiment one. At the same time, as for the operating information of the analog module in the above embodiment, the linearity compensation module in this embodiment may record or store different operating information such as process information, voltage information, temperature information, frequency information, and output the compensation signals required by the signal (which may be recorded in a comparison table), and comprehensively consider the compensation signals and the above compensation signals for using as the basis for the linearity compensation module to perform configuration. For the case where the operating information of the analog module is introduced in the above embodiment, the linearity compensation module in this embodiment may calculate the non-linear compensation in the following methods. In this embodiment, after the corresponding compensation current is determined based on the first and/or second configuration signals, the combinations of the transconductance units may be determined for configuration by the following methods.

Enumeration: The possible combinations of the plurality of transconductance units in the linearity compensation module are arranged in sequence, the first and/or second configuration signals are substituted into each combination of the transconductance units to traverse all possible combinations, and the compensation signals output by different combinations of the transconductance units are tried in sequence, so as to acquire a corresponding combination of the transconductance units with the best linearity compensation effect as the actual configuration of the plurality of transconductance units in the linearity compensation module.

Search: Different configuration signals corresponding to the analog module are tested in advance to acquire the compensation signal corresponding to each configuration signal, and thus the combination of the transconductance units corresponding to the compensation signals is determined. In the actual compensation process of the analog circuit, after acquiring the first and second configuration signals, the linearity compensation module may determine the combination of transconductance units corresponding to the current configuration signal based on the correspondence relationship between the above configuration signal and the combination of the transconductance units, and perform configuration accordingly.

The above two methods are merely configuration methods for configuring combinations of the plurality of transconductance units by the linearity compensation module in this embodiment, and any method that may configure the combinations of the transconductance units according to the correspondence relationship of compensation currents in this embodiment shall fall into the protection scope of the present disclosure, which is not limited herein.

In this embodiment, on the one hand, the linearity compensation module in the compensation circuit can absorb the input signals, the output signals and the process signals of the analog module as well as the process information in the operation of the analog module, and supply compensation current for the output signal of the OTA in the analog circuit for compensation based thereon, thus reducing the swing of signals at the input terminal of the OTA and improving the linearity of the output signal at the output terminal. Therefore, there is no need to strictly consider the gain, bandwidth, applicable process and other parameters of the OTA in the OTA design process of the analog circuit, thus indirectly reducing the performance requirements and cost of the OTA design. On the other hand, since the transconductance units of the linearity compensation module in this embodiment are flexible in size, and the corresponding combinations of the transconductance units can be configured based on different configuration signals in the analog circuit, the linearity compensation module can be applied to analog modules with different processes, bandwidth modes and frequency components, thus significantly improving the reliability of linearity compensation corresponding to the analog modules with different processes, bandwidth modes and frequency components, and allowing the linearity compensation module to be configurable or adaptable.

In an embodiment, each transconductance unit 4062 includes a plurality of transconductance sub-units 40622 connected in parallel to each other. The plurality of transconductance units 4062 and the plurality of transconductance sub-units 40622 are configured to acquire the first and second configuration signals, and configure combinations of the plurality of transconductance units 4062 and combinations of the plurality of transconductance sub-units 40622 in the transconductance unit 4062 based on the first and/or second configuration signals to provide compensation signals to the output nodes.

Figure 11:
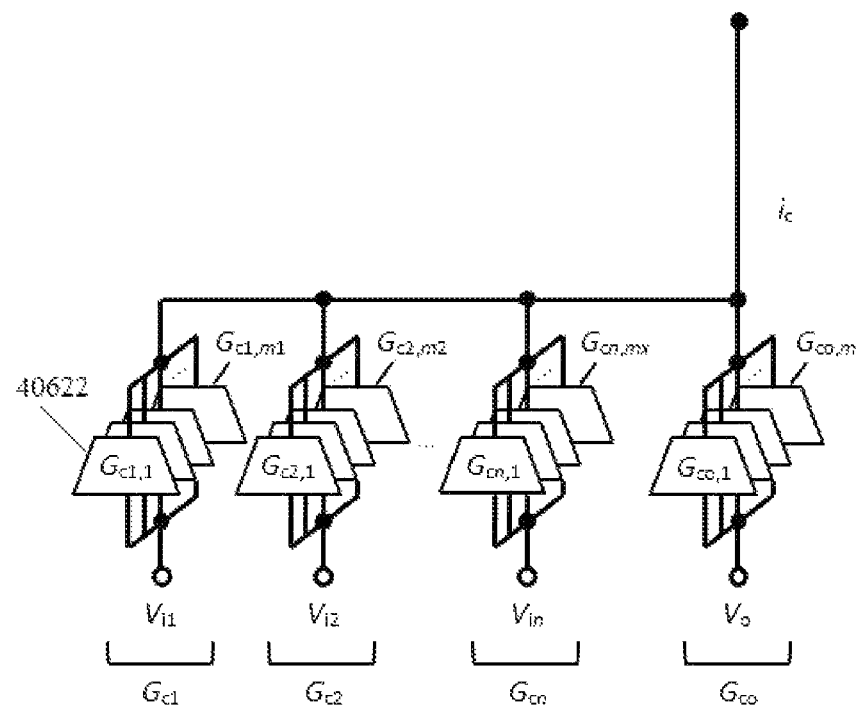
FIG. 11 is a circuit diagram (IV) of the linearity compensation module provided according to an embodiment of the present disclosure.

FIG. 11 is a circuit diagram (IV) of the linearity compensation module provided according to the embodiment of the present disclosure. As shown in FIG. 11, in the above embodiment, each transconductance unit is formed by connecting the plurality of transconductance sub-units in parallel. Taking the transconductance unit $G_{c1}$ as an example, the transconductance unit $G_{c1}$ includes the plurality of transconductance sub-units $G_{c1,\,1}$, $G_{c1,\,2}$, ..., $G_{c1,\,m1}$ connected in parallel. The linearity compensation module configures the combinations of the plurality of transconductance units and the combinations of the plurality of transconductance sub-units in each transconductance unit based on the first and/or second configuration signals, indicating that there are two configuration dimensions in the configuration by the linearity compensation module. The first dimension indicates the configuration of the objects and the number of the transconductance units, and the second dimension indicates the configuration of the objects and the number of the transconductance sub-units in each transconductance unit based on the configuration of the objects and the number of the transconductance units in the first dimension. When different objects and the number of the transconductance units and different objects and the number of the transconductance sub-units in each transconductance unit are configured to take part in the transconductance on signals, different transconductance results for signals may be obtained.

Since the plurality of transconductance sub-units in each transconductance unit are connected in parallel, the transconductance value of a transconductance unit can be adjusted by configuring different objects and the number of the transconductance sub-units in the same transconductance unit. Therefore, when the different transconductance units have different device sizes in the above embodiment, the transconductance value of a transconductance unit can also be adjusted by configuring the objects and the number of the transconductance sub-units in each transconductance unit, that is, configuring the objects and the number of the transconductance sub-units in each transconductance unit based on the first configuration signals and the second configuration signals.

Accordingly, different transconductance sub-units in the same transconductance unit may adopt devices of the same size or different sizes. When the devices are of the same size, the transconductance on the first and/or second configuration signals can be realized by configuring the number of the transconductance sub-units to form corresponding combinations. When the devices are of different sizes, since the transconductance value of the transconductance sub-units differs due to different device sizes of the transconductance sub-units, the objects of the transconductance sub-units of corresponding sizes may be configured for the different first and/or second configuration signals to form corresponding combinations based on the configuration of the number of the transconductance sub-units. In order to further improve the applicability of the linearity compensation module to the configuration of the first and/or second configuration signals, the plurality of transconductance sub-units in each transconductance unit in the linearity compensation module in this embodiment may adopt devices of different sizes. In the linearity compensation module shown in FIG. 4, by taking the transconductance unit $G_{c1}$ including the plurality of transconductance sub-units $G_{c1,\,1}$, $G_{c1,\,2}$, ..., $G_{c1,\,m1}$ as an example, there are at least two transconductance sub-units of different device sizes in the transconductance unit $G_{c1}$, and the plurality of transconductance sub-units may be different from each other in device size, or may be partially different in device size, which is not limited herein.

Regardless of whether or not the plurality of transconductance sub-units have the same device size, different transconductance units having different transconductance values can be formed by connecting different number of transconductance sub-units in parallel. Therefore, the applicability of the linearity compensation module can be significantly improved by the plurality of configuration dimensions of the linearity compensation module in the above embodiment.

In this embodiment, after the plurality of configuration dimensions for forming different transconductance sub-units are introduced, based on the method by which the transconductance units compensate and the method by which the combinations of the transconductance units are configured, that is, based on the configuration of the transconductance units by the linearity compensation module in the above embodiment, the plurality of transconductance sub-units in each transconductance unit are configured again.

In the process of configuring the compensation current, the compensation signals may also be acquired by the method in which the linearity compensation module calculates the compensation signals using the plurality of transconductance units, which is not repeated herein.

Accordingly, after determining the compensation current by the above method, the method in the above embodiment may still be adopted to determine the combinations of the transconductance units for configuration in this embodiment, for example:

Enumeration: The possible combinations of the plurality of transconductance units in the linearity compensation module and the plurality of transconductance sub-units in each transconductance unit are arranged in sequence, the first and/or second configuration signals are substituted into each combination to traverse all possible combinations, and the compensation signals output by different combinations of the transconductance units and the transconductance sub-units in each transconductance unit are tried in sequence, so as to acquire a corresponding combination with the optimal linearity compensation effect as the actual configuration of the plurality of transconductance units and the plurality of transconductance sub-units in each transconductance unit in the linearity compensation module.

Search: Different configuration signals corresponding to the analog module are tested in advance to acquire the compensation signal corresponding to each configuration signal, and thus the combination of the transconductance units and the combination of the plurality of the transconductance sub-units in each transconductance unit corresponding to the compensation signal are determined. In the actual compensation process of the analog circuit, after acquiring the first configuration signals and second configuration signals, the linearity compensation module can determine the combination of transconductance units corresponding to the current configuration signal based on the correspondence relationship between the above configuration signal and the combination of the transconductance units, and perform configuration accordingly.

With the composition of the transconductance unit in the above embodiment, the applicability of the linearity compensation module to the configuration can be improved due to the plurality of configuration dimensions during configuration based on the first and/or second configuration signals, so that the effectiveness and reliability of the linearity compensation module for linearity compensation corresponding to different analog modules can be significantly improved.

In an embodiment, the transconductance sub-unit includes a transconductance transistor and a bias transistor. A gate of the transconductance transistor is configured to acquire first configuration signals and/or second configuration signals, and a drain of the transconductance transistor is configured to provide the signals to a source of the bias transistor. A gate of the bias transistor is configured to acquire bias signals, and a drain of the bias transistor is configured to provide compensation signals. Both the transconductance transistor and the bias transistor are PMOS transistors or NOMS transistors.

The transconductance transistor and the bias transistor constitute a cascode transconductance sub-unit with an internal structure still as shown in FIG. 5 or FIG. 6. As shown in FIG. 5, both the transconductance transistor Ma and the bias transistor Mb are NMOS transistors, and a gate of the transconductance transistor Ma serves as an input terminal of the transconductance sub-unit to acquire the first or second configuration signals. A drain of the transconductance transistor Ma is configured to provide signals to a source of the bias transistor Mb, and a source of the transconductance transistor Ma is configured to acquire a GND signal. A gate of the bias transistor Mb is configured to acquire the bias signal $V_b$, and a drain of the bias transistor Mb is configured to provide compensation signals. The bias signal $V_b$ acquired by the gate of the bias transistor Mb may be provided by a DC bias module. The DC bias module may be provided by the analog module, i.e., the process signal in the analog module may be provided as a bias signal to the bias transistor, or the DC bias module may be provided independently, i.e., a separate circuit module is provided for the bias signal of the bias transistor, which is not limited herein. As shown in FIG. 6, both the transconductance transistor Ma and the bias transistor Mb are PMOS transistors. In this case, the transconductance transistor Ma and the bias transistor Mb are connected in the same way as in the case where the transconductance transistor Ma and the bias transistor Mb are NMOS transistors, which will not be repeated herein.

The operating principle of the cascode transconductance sub-unit in the above embodiment is the same as that in Embodiment one, which will not be repeated herein.

In an embodiment, each transconductance sub-unit includes an input terminal, an output terminal, and current mirrors disposed between the input terminal and the output terminal. The output terminal is configured to provide compensation signals. The input terminal includes the PMOS and NMOS transistors, where a source of the PMOS transistor and a source of the NMOS transistor are connected and configured to acquire the first and/or second configuration signals; a gate of the PMOS transistor is configured to acquire first bias signals, a gate of the NMOS transistor is configured to acquire second bias signals, and a drain of the PMOS transistor and a drain of the NMOS transistor are configured to provide the signals to the current mirrors.

The transconductance transistor and the bias transistor constitute a common-gate transconductance sub-unit with an internal structure still as shown in FIG. 7. As shown in FIG. 7, an input terminal of the common-gate transconductance sub-unit includes two input transistors Mp and Mn. The input transistor Mp is a PMOS transistor, the input transistor Mn is a NMOS transistor, and a source of the input transistor Mp is connected to a source of the input transistor Mn and configured to receive the input signals, namely the first or second configuration signals in this embodiment. Gates of the input transistor Mp and the input transistor Mn are respectively configured to receive the bias signals. The gate of the input transistor Mp is configured to acquire a first bias signal $V_{bp}$ and the gate of the input transistor Mn is configured to acquire a second bias signal $V_{bp}$, and a drain of the input transistor Mp and a drain of the input transistor Mn are respectively connected to the corresponding current mirror modules and output signals through the current mirror modules.

The operating principle of the common-gate transconductance sub-unit in the above embodiment is the same as that in the Embodiment one, which will not be repeated herein.

In an embodiment, the plurality of transconductance sub-units in each transconductance unit adopt PMOS transistors and/or NMOS transistors of different sizes.

In an embodiment, the first configuration signal includes input signals, output signals, and process signals at any position between the input nodes and the output nodes in the analog module.

The first configuration signal may also be a combination of the input signals, output signals and process signals, which is not limited herein.

In an embodiment, when the first configuration signals are the input signals, the plurality of transconductance units are configured in such a way that each transconductance unit acquires the input signals from one input node. The transconductance units may correspond to the first configuration signals in number, so as to ensure that the transconductance units can compensate the nonlinear components in each input signal.

Embodiment Five

In this embodiment, a compensation chip is further provided, including the compensation circuit in Embodiment four and the embodiment mentioned above corresponding to Embodiment four. The technical scheme of the compensation circuit in the compensation chip in this embodiment corresponds to the compensation circuit in Embodiment four, which will not be repeated herein.

Embodiment Six

Figure 12:
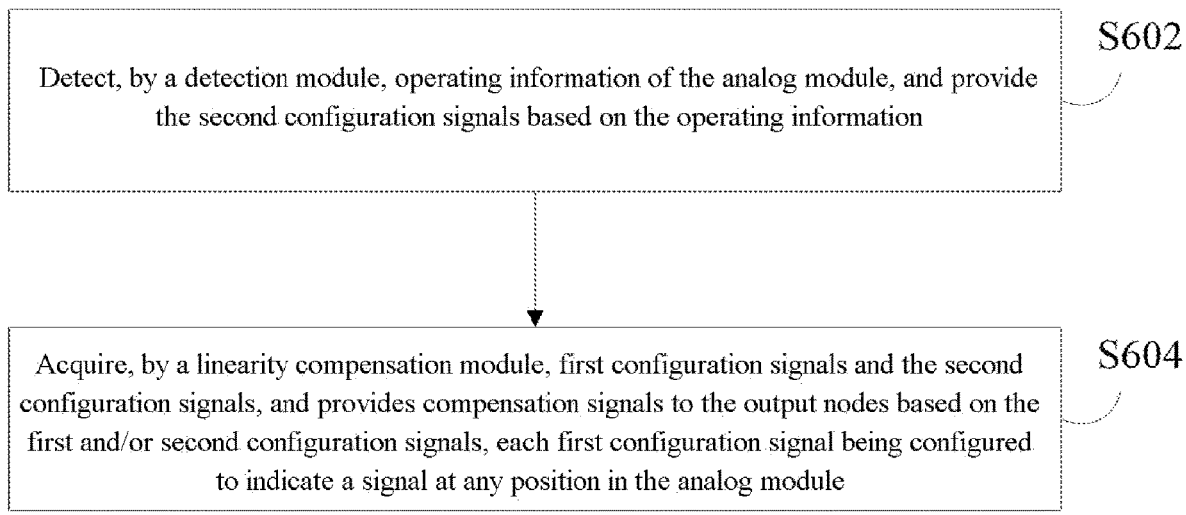
FIG. 12 is a flowchart (II) of the compensation method provided according to an embodiment of the present disclosure.

In this embodiment, a compensation method for providing compensation signals to an analog module is further provided. The analog module includes a plurality of input nodes and a plurality of output nodes. FIG. 12 is a flowchart (II) of the compensation method provided according to the embodiment of the present disclosure. As shown in FIG. 12, the compensation method includes steps of S602 and S604.

At step S602, the detection module detects the operating information of the analog module and provides the second configuration signals based on the operating information.

At step S604, the linearity compensation module acquires first configuration signals and the second configuration signals, and provides compensation signals to the output nodes based on the first and/or second configuration signals. Each first configuration signal is configured to indicate a signal at any position in the analog module.

In this embodiment, the compensation method can detect the operating information of the analog module and provide the second configuration signals based on the operating information, so as to acquire the compensation signals based on the second configuration signals and the first configuration signals provided by the analog module and provide the signals to the output nodes of the analog module for linearity compensation. Accordingly, the above compensation method can solve the problem of large deviations in linearity compensation due to the lack of comprehensive consideration of nonlinearity sources and influencing factors in the linearity compensation process in related technologies, thus improving the reliability of the linearity compensation technology.

In an embodiment, the operating information includes at least one of process information, voltage information, temperature information and frequency information, and the second configuration information includes at least one of a process configuration signal, a voltage configuration signal, a temperature configuration signal and a frequency configuration signal.

The technical significance and acquisition method of the above operating information and the second configuration signals correspond to those in the Embodiment four, which will not be repeated herein.

In an embodiment, the compensation method further includes: acquiring the first and/or second configuration signals in an $m^{th}$ cycle, and providing an $m^{th}$ compensation signal based on the first and/or second configuration signals; acquiring a first configuration signal and a second configuration signal in an $(m+1)^{th}$ cycle, and providing an $(m+1)^{th}$ compensation signal based on the first and second configuration signals; and providing the $m^{th}$ compensation signal to the output node when a difference in value between the $(m+1)^{th}$ compensation signal and the $m^{th}$ compensation signal is within a predetermined range.

The m is an integer, and the assignment of m only represents a certain operating cycle of the analog module, i.e., the technical scheme in the above embodiment may be adopted for any operating cycle of the analog module; m+1 represents a next cycle after the $m^{th}$ cycle. For example, when the $m^{th}$ cycle is a $0^{th}$ cycle, the $(m+1)^{th}$ cycle is a $1^{st}$ cycle. The assignment of m is not limited in this embodiment, i.e., when the $m^{th}$ cycle is the $0^{th}$ cycle and the $(m+1)^{th}$ cycle is the $1^{st}$ cycle, m may be assigned as 1 again, i.e., the $m^{th}$ cycle is the $1^{st}$ cycle and the $(m+1)^{th}$ cycle is the $2^{nd}$ cycle, indicating that the technical scheme in this embodiment can be implemented cyclically according to the operating cycle of the analog module.

The case with m as 0 is described below.

In the $0^{th}$ cycle, namely the initial operating stage of the analog module, in S604, the linearity compensation module acquires the input signals or output signals in the analog module as the first configuration signals, and calculates the compensation signal based on the first configuration signals. The compensation signal is calculated as described in the above embodiment and will not be repeated herein. In this case, the compensation signal provided serves as the $0^{th}$ compensation signal, which is an initial value of the compensation signal provided by the linearity compensation module.

In the $1^{st}$ cycle in which the analog module is already in a stable operating state, in step S602, the detection module may detect the operating information of the analog module, such as process information, voltage information, temperature information, and frequency information, obtain, by coding and encapsulating the operating information of the analog module, corresponding second configuration signals, such as process configuration signals, voltage configuration signals, temperature configuration signals, and frequency configuration signals, and provide the second configuration signals to the linearity compensation module. Also in step S604, the linearity compensation module recalculates the compensation signals based on the first configuration signals provided by the analog module in the $1^{st}$ cycle and the second configuration signals. In this case, the compensation signal serves as the first compensation signal.

On the premise that a first compensation signal is acquired, the first compensation signal may be compared with the $0^{th}$ compensation signal to determine whether the difference in value between the first compensation signal and the $0^{th}$ compensation signal is within the predetermined range. The difference in value between the first compensation signal and the $0^{th}$ compensation signal may be understood as an error between the compensation signals provided by the linearity compensation module in the $1^{st}$ cycle and the $0^{th}$ cycle. When the difference in value between the first compensation signal and the $0^{th}$ compensation signal is within the predetermined range, the error is acceptable, and the impact of the operating information of the analog module on the linearity of the analog module in the $1^{st}$ cycle is within a controllable range compared with that in the $0^{th}$ cycle. Therefore, the $0^{th}$ compensation signal provided by the linearity compensation module in the $0^{th}$ cycle may serve as a steady-state compensation signal, so that the analog module can be effectively compensated for linearity based on the $0^{th}$ compensation signal.

Conversely, when the difference in value between the first compensation signal and the $0^{th}$ compensation signal is beyond the predetermined range, the operating information of the analog module has a greater impact on the formation of linearity of the analog module in the $1^{st}$ cycle. If the linearity of the output signal of the analog module is still compensated with the $0^{th}$ compensation signal, effective linearity compensation cannot be realized, and there is a need to provide the compensation signal again.

In this case, m may be assigned as 1, and the above process may be repeated with the $m^{th}$ cycle as the $1^{st}$ cycle. In to the case where the linearity compensation module has acquired the first compensation signal in the $1^{st}$ cycle, the detection module detects the operating information of the analog module again in the $(m+1)^{th}$ cycle, namely a $2^{nd}$ cycle, and acquires a new second configuration signal based on the operating information detected again, to provide to the linearity compensation module.

In the $2^{nd}$ cycle, the linearity compensation module recalculates the compensation signal based on the first and second configuration signals in the current cycle, and takes the compensation signal as the second compensation signal. Similarly, on the premise that the second compensation signal is acquired, the second compensation signal may be compared with the first compensation signal to determine whether the difference in value between the second compensation signal and the first compensation signal is within the predetermined range. When the difference in value between the second compensation signal and the first compensation signal is within the predetermined range, the impact of the operating information of the analog module on the linearity of the analog module in the $2^{nd}$ cycle is within the controllable range compared with that in the $1^{st}$ cycle. Therefore, the first compensation signal provided by the linearity compensation module in the $1^{st}$ cycle may serve as a steady-state compensation signal, so that the analog module can be effectively compensated for linearity based on the first compensation signal.

Accordingly, when the difference in value between the second compensation signal and the first compensation signal in the $2^{nd}$ cycle is still beyond the predetermined range, m is re-assigned as 3, a third compensation signal calculated in a $3^{rd}$ cycle is compared with the second compensation signal, and the above process is repeated. By analogy, when the difference in value between a $(m+1)^{th}$ compensation signal and a $m^{th}$ compensation signal is within the predetermined range, the linearity compensation module may provide the $m^{th}$ compensation signal to the output nodes of the analog module for linearity compensation. The above process may be referred to as an iterative process of the linearity compensation module, through which the compensation signals provided by the linearity compensation module to the output nodes of the analog module can effectively and reliably compensate the linearity of the analog module in the current cycle.

In the above technical scheme, on the basis that the operating information of the analog module is introduced to provide the compensation signals in this embodiment, the compensation signal can be ensured to provide effective linearity compensation in the current cycle, thus further improving the reliability of linearity compensation of the analog module.

In an embodiment, the compensation method further includes: when a change in the operating information of the analog module is detected in an $n^{th}$ cycle, providing the second configuration signal again based on the changed operating information; acquiring the first and second configuration signals in the $n^{th}$ cycle and providing an $n^{th}$ compensation signal based on the first and second configuration signals; and acquiring the first and second configuration signals in an $(n+1)^{th}$ cycle, and providing an $(n+1)^{th}$ compensation signal based on the first and second configuration signals; and providing the $n^{th}$ compensation signal to the output node when the difference in value between the $(n+1)^{th}$ compensation signal and the $n^{th}$ compensation signal is within a predetermined range.

The n is an integer, and the assignment of n only represents an operating cycle of the analog module, i.e., the technical scheme in the above embodiment may be adopted for any operating cycle of the analog module; n+1 represents a next cycle after the $n^{th}$ cycle. For example, when the $n^{th}$ cycle is the $2^{nd}$ cycle, the $(n+1)^{th}$ cycle is the $3^{rd}$ cycle. The assignment of n is not limited in this embodiment, i.e., when the $n^{th}$ cycle is the $2^{nd}$ cycle and the $(n+1)^{th}$ cycle is the $3^{rd}$ cycle, n may be assigned as 3 again, i.e., the $n^{th}$ cycle is the $1^{st}$ cycle and the $(n+1)^{th}$ cycle is a 4th cycle, indicating that the technical scheme in this embodiment can be implemented cyclically according to the operating cycle of the analog module.

The case with n as 5 is described below.

In a $5^{th}$ cycle, after detecting a change in the operating information of the analog module, the step S602 includes acquiring the second configuration signal again based on the changed operating information and providing the second configuration to the linearity detection module. After acquiring the second configuration signal reacquired based on the changed operating signal in the $5^{th}$ cycle, the linearity detection module re-calculates the compensation signal in the $5^{th}$ cycle based on the first and second configuration signals in the current cycle. The compensation signal is calculated as described in the above embodiment and will not be repeated herein. In this case, the compensation signal calculated serves as a fifth compensation signal, which is an initial value of the compensation signal provided by the linearity compensation module after the operating information of the analog module changes.

In a $6^{th}$ cycle in which the analog module is already in a stable operating state again after the operating information changes, the detection module may acquire the second configuration signal based on the operating information of the corresponding analog module in the $6^{th}$ cycle and provide the second configuration signal to the linearity detection module. The linearity detection module re-calculates the compensation signal based on the first configuration signal of the analog module in the $6^{th}$ cycle together with the above second configuration signal. In this case, the compensation signal serves as a sixth compensation signal.

On the premise that the sixth compensation signal is acquired, the sixth compensation signal may be compared with the fifth compensation signal to determine whether the difference in value between the sixth compensation signal and the fifth compensation signal is within the predetermined range. The difference in value between the sixth compensation signal and the fifth compensation signal may be understood as an error between the compensation signals provided by the linearity compensation module in the $6^{th}$ cycle and the $5^{th}$ cycle. When the difference in value between the sixth compensation signal and the fifth compensation signal is within the predetermined range, the error is acceptable, and the impact of the operating information of the analog module on the linearity of the analog module in the $6^{th}$ cycle is within the controllable range compared with that in the $5^{th}$ cycle. Therefore, the fifth compensation signal provided by the linearity compensation module in the $5^{th}$ cycle may serve as a steady-state compensation signal, so that the analog module can be effectively compensated for linearity based on the fifth compensation signal.

Conversely, when the difference in value between the sixth compensation signal and the fifth compensation signal is beyond the predetermined range, the change in the operating information of the analog module has a greater impact on the formation of linearity of the analog module in the $6^{th}$ cycle. If the linearity of the output signal of the analog module is still compensated with the fifth compensation signal, effective linearity compensation cannot be realized, and there is a need to provide the compensation signal again.

In this case, n may be assigned as 6, and the above process may be repeated with the $n^{th}$ cycle as the $6^{th}$ cycle. In the case where the linearity compensation module has acquired the sixth compensation signal in the $6^{th}$ cycle, the detection module detects the operating information of the analog module again in the $(n+1)^{th}$ cycle, namely a $7^{th}$ cycle, and acquires a new second configuration signal based on the operating information detected again, to provide to the linearity compensation module.

In the $7^{th}$ cycle, the linearity compensation module re-calculates the compensation signal based on the first and the second configuration signal in the current cycle, and takes the compensation signal as a seventh compensation signal. Similarly, on the premise that the seventh compensation signal is acquired, the seventh compensation signal may be compared with the sixth compensation signal to determine whether the difference in value between the seventh compensation signal and the sixth compensation signal is within the predetermined range. When the difference in value between the seventh compensation signal and the sixth compensation signal is within the predetermined range, the impact of the operating signal of the analog module on the linearity of the analog module in the $7^{th}$ cycle is within the controllable range compared with that in the $6^{th}$ cycle. Therefore, the sixth compensation signal provided by the linearity compensation module in the $6^{th}$ cycle may serve as a steady-state compensation signal, so that the analog module can be effectively compensated for linearity based on the sixth compensation signal.

Accordingly, when the difference in value between the seventh compensation signal and the sixth compensation signal in the $7^{th}$ cycle is still beyond the predetermined range, n is re-assigned as 8, an eighth compensation signal calculated in a $8^{th}$ cycle is compared with the seventh compensation signal, and the above process is repeated. By analogy, when the difference in value between a $(n+1)^{th}$ compensation signal and a $n^{th}$ compensation signal is within the predetermined range, the linearity compensation module may provide the $n^{th}$ compensation signal to the output nodes of the analog module for linearity compensation.

According to the technical scheme, in addition to effectively compensating the linearity in the current cycle of the analog module through iteration, the linearity compensation module can adjust the corresponding compensation signal every time when there is a change in the corresponding operating information of the analog module, so that the compensation signal provided by the linearity compensation module to the output node of the analog module can more reliably compensate the linearity of the analog module after the operating information changes, thereby ensuring that the linearity compensation effect is not diminished due to parameter fluctuation and mode change.

Other technical schemes of the compensation method in this embodiment correspond to the technical schemes of the compensation circuit in Embodiment four and the embodiments corresponding to Embodiment four, which will not be repeated herein.

Through the description of the above embodiments, those having ordinary skill in the art can understand that the method in the above embodiments may be implemented by software and a general hardware platform, and of course may also be implemented by hardware. It is understood that the technical schemes of the present disclosure may be embodied in the form of a software product. The software product is stored in a storage medium (such as ROM/RAM, magnetic disk, and optical disk) and includes a plurality of instructions to enable a terminal device (which may be a mobile phone, a computer, a server, or a network device) to implement the method described in the embodiments of the present disclosure.

Embodiment Seven

Figure 13:
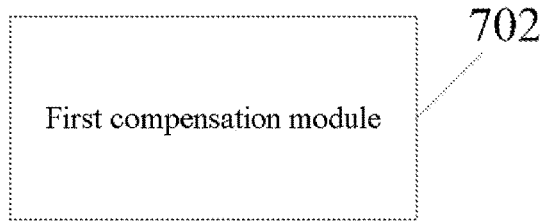
FIG. 13 is a structural block diagram (I) of a compensation device provided according to an embodiment of the present disclosure.

In this embodiment, a compensation device configured to provide compensation signals to an analog module is further provided. The analog module includes a plurality of input nodes and a plurality of output nodes. The compensation device is configured to implement Embodiment three and the embodiments mentioned above, and what has already been described will not be repeated herein. As used below, the term "module" may be a combination of software and/or hardware that implements a predetermined function. Although the device described in the embodiment below may be implemented by software, it is also possible to implement the device by hardware or a combination of software and hardware. FIG. 13 is a structural block diagram (I) of the compensation device provided according to the embodiment of the present disclosure. As shown in FIG. 13, the compensation device includes a first compensation module 701.

The first compensation module 701 is configured to acquire first configuration signals and configure combinations of a plurality of transconductance units based on the first configuration signals to provide compensation signals to the output nodes. Each first configuration signal is configured to indicate a signal at any position in the analog module.

With the compensation device in this embodiment, the combinations of the plurality of transconductance units can be configured based on the acquired first configuration signals to provide the compensation signals to the output nodes in the analog module. Each first configuration signal is configured to indicate a signal at any position in the analog module. Therefore, the above compensation method can solve the problem of large deviations in linearity compensation due to the lack of comprehensive consideration of nonlinearity sources and influencing factors in the linearity compensation process in related technologies, thus improving the reliability of the linearity compensation technology.

Other schemes of the compensation device in this embodiment correspond to those of the compensation method in Embodiment three, which will not be repeated herein.

It should be noted that the above modules may be implemented by software or hardware, in the latter case, the modules may be implemented by, but not limited to, following methods. The above modules are all located in the same processor, or respectively located in different processors in any combination.

Embodiment Eight

Figure 14:
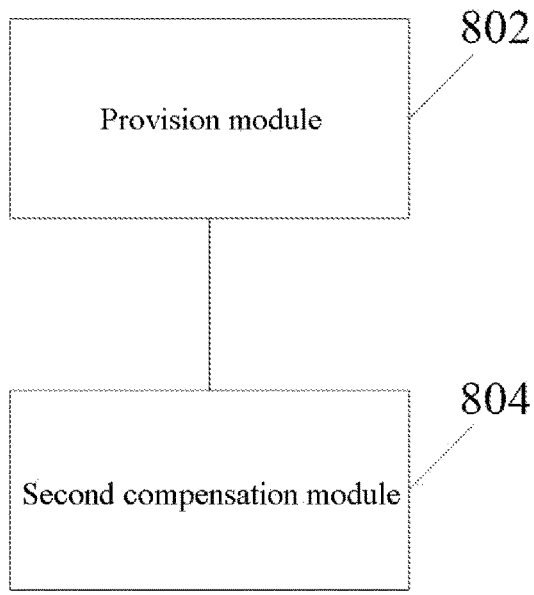
FIG. 14 is a structural block diagram (II) of the compensation device provided according to an embodiment of the present disclosure.

In this embodiment, a compensation device configured to provide compensation signals to an analog module is further provided. The analog module includes a plurality of input nodes and a plurality of output nodes. The compensation device is configured to implement Embodiment six and the embodiments mentioned above, and what has already been described will not be repeated herein. As used below, the term "module" may be a combination of software and/or hardware that implements a predetermined function. Although the device described in the embodiment below may be implemented by software, it is also possible to implement the device by hardware or a combination of software and hardware. FIG. 14 is a structural block diagram (II) of the compensation device provided according to the embodiment of the present disclosure. As shown in FIG. 14, the compensation device includes a provision module 801 configured to detect operating information of the analog module and provide second configuration signals based on the operating information. The second compensation module 802 is configured to acquire first configuration signals and the second configuration signals, and provide compensation signals to the output nodes based on the first and/or second configuration signals. Each first configuration signal is configured to indicate a signal at any position in the analog module.

In this embodiment, the compensation device may detect the operating information of the analog module and provide the second configuration signals based on the operating information, so as to acquire the compensation signals based on the second configuration signals and the first configuration signals provided by the analog module and provide the signals to the output nodes of the analog module for linearity compensation. Accordingly, the above compensation circuit can solve the problem of large deviations in linearity compensation due to the lack of comprehensive consideration of nonlinearity sources and influencing factors in the linearity compensation process in related technologies, thus improving the reliability of the linearity compensation technology.

In an embodiment, the operating information includes at least one of process information, voltage information, temperature information and frequency information, and the second configuration information includes at least one of a process configuration signal, a voltage configuration signal, a temperature configuration signal and a frequency configuration signal.

In an embodiment, the compensation method further includes: acquiring the first and/or second configuration signals in an $m^{th}$ cycle, and providing an $m^{th}$ compensation signal based on the first and/or second configuration signals; acquiring a first configuration signal and a second configuration signal in an $(m+1)^{th}$ cycle, and providing an $(m+1)^{th}$ compensation signal based on the first and second configuration signals; and providing the $m^{th}$ compensation signal to the output node when a difference in value between the $(m+1)^{th}$ compensation signal and the $m^{th}$ compensation signal is within a predetermined range.

In an embodiment, the compensation method further includes: when a change in the operating information of the analog module is detected in an $n^{th}$ cycle, providing the second configuration signal again based on the changed operating information; acquiring the first and second configuration signals in the $n^{th}$ cycle and providing an $n^{th}$ compensation signal based on the first and second configuration signals; and acquiring the first and second configuration signals in an $(n+1)$th cycle, and providing an $(n+1)^{th}$ compensation signal based on the first and second configuration signals; and providing the $n^{th}$ compensation signal to the output node when the difference in value between the $(n+1)^{th}$ compensation signal and the $n^{th}$ compensation signal is within a predetermined range.

Other schemes of the compensation device in this embodiment correspond to those of the compensation method in Embodiment six, which will not be repeated herein.

The above modules may be implemented by software or hardware, in the latter case, the modules may be implemented by, but not limited to, following methods. The above modules are all located in the same processor, or respectively located in different processors in any combination.

Embodiment Nine

According to another embodiment of the present disclosure, a storage medium storing a computer program is further provided, where the computer program, when executed, performs steps of the method in any of the above embodiments.

In this embodiment, the storage medium may be configured to store a computer program for executing a step of S1.

At step S1, a plurality of first configuration signals are acquired, and combinations of a plurality of transconductance units are configured based on the first configuration signals to provide compensation signals to the output nodes. Each first configuration signal is configured to indicate a signal at any position in the analog module.

In this embodiment, the above storage media may include, without limitation, USB flash drives, Read-Only Memory (ROM), Random Access Memory (RAM), mobile HDD, magnetic disks or optical disks, and other media that may store computer programs.

Embodiment Ten

According to another embodiment of the present disclosure, a storage medium storing a computer program is further provided, where the computer program, when executed, performs steps of the method in any of the above embodiments.

In this embodiment, the storage medium may store a computer program for executing following steps of S1 and S2.

At step S1, operating information of the analog module is detected and second configuration signals are provided based on the operating information.

At step S2, first configuration signals and the second configuration signals are acquired, and compensation signals are provided to output nodes based on the first and/or second configuration signals. Each first configuration signal is configured to indicate a signal at any position in the analog module.

In this embodiment, the storage media may include, without limitation, USB flash drives, ROM, RAM, mobile HDD, magnetic disks or optical disks, and other media that may store computer programs.

Embodiment Eleven

According to this embodiment of the present disclosure, an electronic device is further provided, including a memory and a processor. The memory stores a computer program which, when executed by the processor, causes the processor to perform steps of the method in any of the above embodiments.

The electronic device may further include transmission equipment and I/O equipment. The transmission equipment and the I/O equipment are both connected to the processor.

In this embodiment, the processor may be configured to execute a step of S1 below by the computer program.

At step S1, a plurality of first configuration signals are acquired, and combinations of a plurality of transconductance units are configured based on the first configuration signals to provide compensation signals to the output nodes. Each first configuration signal is configured to indicate a signal at any position in the analog module.

Specific examples in this embodiment may refer to the examples described in the embodiments mentioned above, which will not be repeated in this embodiment.

Embodiment Twelve

According to this embodiment of the present disclosure, an electronic device is further provided, including a memory and a processor. The memory stores a computer program which, when executed by the processor, causes the processor to perform steps of the method in any of the above embodiments.

The electronic device may further include transmission equipment and I/O equipment. The transmission equipment and the I/O equipment are both connected to the processor.

In this embodiment, the processor may be configured to execute following steps of S1 and S2 by the computer program.

At step S1, operating information of the analog module is detected and second configuration signals are provided based on the operating information.

At step S2, first configuration signals and the second configuration signals are acquired, and compensation signals are provided to output nodes based on the first and/or second configuration signals. Each first configuration signal is configured to indicate a signal at any position in the analog module.

Specific examples in this embodiment may refer to the examples described in the embodiments mentioned above, which will not be repeated in this embodiment.

It should be understood by those having ordinary skill in the art that the plurality of modules or steps according to the present disclosure may be implemented by a general-purpose computing device, and may be concentrated in a single computing device or distributed in a network including a plurality of computing devices. These modules or steps may be implemented by program codes executable by the computing devices, so that such modules or steps may be stored in a storage device and executed by the computing devices. In some cases, the steps shown or described may be performed in an order different than presented herein, either by fabricating them separately into a plurality of integrated circuit modules, or by fabricating the plurality of modules or steps into a single integrated circuit module. Therefore, any particular combination of hardware and software is not limited herein.

The invention claimed is:

1. A compensation circuit, comprising:
an analog module comprising at least one input node and at least one output node, wherein each of the at least one input node is configured to receive a corresponding input signal and each of the at least one output node is configured to output a corresponding output signal; and
a linearity compensation module comprising a plurality of transconductance units, wherein the plurality of transconductance units are configured to acquire a first configuration signal and configure a combination of the plurality of transconductance units based on the first configuration signal to provide a compensation signal to the at least one output node to compensate for nonlinear components comprised in the at least one output signal, and said first configuration signal comprises any of the at least one input signal, the at least one output signal, or process signals located at any position between the at least one input node and the at least one output node in the analog module.

2. The circuit of claim 1, wherein each of the transconductance units comprises a plurality of transconductance sub-units connected in parallel to each other; and
the plurality of transconductance units and the plurality of transconductance sub-units are configured to acquire the first configuration signal and configure a combination of the plurality of transconductance units and a combination of the plurality of transconductance sub-units in each transconductance unit based on the first configuration signal to provide the compensation signal to the output node.

3. The circuit of claim 2, wherein each transconductance sub-unit comprises a transconductance transistor and a bias transistor, wherein a gate of the transconductance transistor is configured to acquire the first configuration signal, and a drain of the transconductance transistor is configured to provide a signal to a source of the bias transistor; a gate of the bias transistor is configured to acquire a bias signal, and a drain of the bias transistor is configured to provide the compensation signal; and
both the transconductance transistor and the bias transistor are PMOS transistors or NOMS transistors.

4. The circuit of claim 2, wherein each transconductance sub-unit comprises an input terminal, an output terminal, and a current mirror disposed between the input terminal and the output terminal, the output terminal being configured to provide the compensation signal; and
the input terminal comprises the PMOS and NMOS transistors, wherein a source of the PMOS transistor and a source of the NMOS transistor are connected and configured to acquire the first configuration signal, a gate of the PMOS transistor is configured to acquire a first bias signal, a gate of the NMOS transistor is configured to acquire a second bias signal, and a drain of the PMOS transistor and a drain of the NMOS transistor are configured to provide a signal to the current mirror.

5. The circuit of claim 3, wherein the plurality of transconductance sub-units in each transconductance unit are configured to adopt the PMOS transistors of different sizes; or, the plurality of transconductance sub-units in each transconductance unit are configured to adopt the NMOS transistors of different sizes.

6. The circuit of claim 4, wherein the plurality of transconductance sub-units in each transconductance unit are configured to adopt the PMOS transistors of different sizes; or, the plurality of transconductance sub-units in each transconductance unit are configured to adopt the NMOS transistors of different sizes; or, the plurality of transconductance sub-units in each transconductance unit are configured to adopt the PMOS transistors of different sizes and NMOS transistors of different sizes.

7. The circuit of claim 1, wherein the compensation circuit further comprises an operational transconductance amplifier (OTA) connected between the at least one input node and the at least one output node, and each of the at least one output node is configured to output the corresponding output signal based on the at least one input signal being processed by the OTA;
wherein the linearity compensation module configured to compensate for nonlinear components generated by the analog module; and
wherein the linearity compensation module is further configured to generate a compensation current by inputting the first configuration signal to a corresponding combination of transconductance units of the plurality of transconductance units and then summing the resulting currents, and to provide the compensation current to the at least one output node of the analog module to compensate for the nonlinear components comprised in the at least one output signal, wherein the corresponding combination of transconductance units represents the combination of transconductance units of the plurality of transconductance units that provides the optimal linearity compensation for the acquired first configuration signal.

8. The circuit of claim 1, wherein, in response to the first configuration signal being the input signal, the plurality of transconductance units are configured to acquire the first configuration signal by the following method that each of the transconductance units acquires the input signal from one input node.

9. A compensation method for providing a compensation signal to an analog module comprising at least one input node and at least one output node, each of the at least one input node being configured to receive a corresponding input signal and each of the at least one output node being configured to output a corresponding output signal, comprising:
acquiring a first configuration signal, and configuring a combination of a plurality of transconductance units based on the first configuration signal to provide the compensation signal to the at least one output node to compensate for nonlinear components comprised in the at least one output signal, wherein said first configuration signal comprises any of the at least one input signal, the at least one output signal, or process signals located at any position between the at least one input node and the at least one output node in the analog module.

10. The method of claim 9, wherein the compensation circuit further comprises an operational transconductance amplifier (OTA) connected between the at least one input node and the at least one output node, and each of the at least one output node is configured to output the corresponding output signal based on the at least one input signal being processed by the OTA;
wherein, configuring a combination of a plurality of transconductance units based on the first configuration signal to provide the compensation signal to the at least one output node to compensate for nonlinear components comprised in the at least one output signal, comprises:
configuring a linearity compensation module to generate a compensation current by inputting the first configuration signal to a corresponding combination of transconductance units of the plurality of transconductance units of the linearity compensation module and then summing the resulting currents, and to provide the compensation current to the at least one output node of the analog module to compensate for the nonlinear components comprised in the at least one output signal, wherein the corresponding combination of transconductance units represents the combination of transconductance units of the plurality of transconductance units that provides the optimal linearity compensation for the acquired first configuration signal.

11. A compensation circuit, comprising:
an analog module comprising at least one input node and at least one output node, wherein each of the at least one input node is configured to receive a corresponding input signal and each of the at least one output node is configured to output a corresponding output signal;
a detection module configured to detect operating information of the analog module and provide a second configuration signal based on the operating information; and
a linearity compensation module comprising a plurality of transconductance units, wherein the plurality of transconductance units are configured to acquire a first configuration signal and the second configuration signal, and configure a combination of the plurality of transconductance units based on at least one of the first configuration signal and second configuration signal to provide a compensation signal to the at least one output node to compensate for nonlinear components comprised in the at least one output signal, said first configuration signal comprises any of the at least one input signal, the at least one output signal, or process signals located at any position between the at least one input node and the at least one output node in the analog module.

12. The circuit of claim 11, wherein the operating information comprises at least one of process information, voltage information, temperature information and frequency information; and the second configuration signal comprises at least one of a process configuration signal, a voltage configuration signal, a temperature configuration signal and a frequency configuration signal.

13. The circuit of claim 11, wherein the linearity compensation module is configured to:
acquire a target configuration signal in an $m^{th}$ cycle and provide an $m^{th}$ compensation signal based on the target configuration signal, the target configuration signal comprising at least one of the first configuration signal and the second configuration signal, and m is a non-negative integer;
acquire the first configuration signal and the second configuration signal in an $(m+1)^{th}$ cycle, and provide an $(m+1)^{th}$ compensation signal based on the first configuration signal and the second configuration signal; and
provide the $m^{th}$ compensation signal to the output node in response to a difference in value between the $(m+1)^{th}$ compensation signal and the $m^{th}$ compensation signal being within a predetermined range.

14. The circuit of claim 13, wherein the detection module is further configured to:
in response to detecting a change in the operating information of the analog module in an $n^{th}$ cycle, provide the second configuration signal again to the linearity compensation module based on the changed operating information, where n is a non-negative integer;
the linearity compensation module is further configured to:
acquire the first configuration signal and the second configuration signal in the $n^{th}$ cycle, and provide an $n^{th}$ compensation signal based on the first configuration signal and
the second configuration signal;
acquire the first configuration signal and the second configuration signal in an $(n+1)^{th}$ cycle, and provide an $(n+1)^{th}$ compensation signal based on the first configuration signal and the second configuration signal; and
provide the $n^{th}$ compensation signal to the output node in response to the difference in value between the $(n+1)^{th}$ compensation signal and the $n^{th}$ compensation signal being within a predetermined range.

15. The circuit of claim 11, wherein the compensation circuit further comprises an operational transconductance amplifier (OTA) connected between the at least one input node and the at least one output node, and each of the at least one output node is configured to output the corresponding output signal based on the at least one input signal being processed by the OTA;
wherein the linearity compensation module configured to compensate for nonlinear components generated by the analog module; and wherein the linearity compensation module is further configured to generate a compensation current by inputting the at least one of the first configuration signal and second configuration signal to a corresponding combination of transconductance units of the plurality of transconductance units and then summing the resulting currents, and to provide the compensation current to the at least one output node of the analog module to compensate for the nonlinear components comprised in the at least one output signal, wherein the corresponding combination of transconductance units represents the combination of transconductance units of the plurality of transconductance units that provides the optimal linearity compensation for the at least one of the first configuration signal and second configuration signal.

16. The circuit of claim 11, wherein each of the transconductance units comprises a plurality of transconductance sub-units connected in parallel to each other; and the plurality of transconductance units and the plurality of transconductance sub-units are configured to acquire the first configuration signal and the second configuration signal, and configure a combination of the plurality of transconductance units and a combination of the plurality of transconductance sub-units in each transconductance unit based on at least one of the first configuration signal and the second configuration signal to provide the compensation signal to the output node.

17. The circuit of claim 16, wherein each transconductance sub-unit comprises a transconductance transistor and a bias transistor, wherein a gate of the transconductance transistor is configured to acquire at least one of the first configuration signal and the second configuration signal, and a drain of the transconductance transistor is configured to provide a signal to the source of the bias transistor; a gate of the bias transistor is configured to acquire a bias signal, and a drain of the bias transistor is configured to provide the compensation signal; and both the transconductance transistor and the bias transistor are PMOS transistors or NOMS transistors.

18. The circuit of claim 16, wherein each transconductance sub-unit comprises an input terminal, an output terminal, and a current mirror disposed between the input terminal and the output terminal, the output terminal being configured to provide the compensation signal; and the input terminal comprises the PMOS and NMOS transistors, wherein a source of the PMOS transistor and a source of the NMOS transistor are connected and configured to acquire at least one of the first configuration signal and the second configuration signal; a gate of the PMOS transistor is configured to acquire a first bias signal, a gate of the NMOS transistor is configured to acquire a second bias signal, and a drain of the PMOS transistor and a drain of the NMOS transistor are configured to provide a signal to the current mirror.

19. The circuit of claim 17, wherein the plurality of transconductance sub-units in each transconductance unit are configured to adopt PMOS transistors of different sizes; or, the plurality of transconductance sub-units in each transconductance unit are configured to adopt the NMOS transistors of different sizes.

20. The circuit of claim 18, wherein the plurality of transconductance sub-units in each transconductance unit are configured to adopt the PMOS transistors of different sizes; or, the plurality of transconductance sub-units in each transconductance unit are configured to adopt the NMOS transistors of different sizes; or, the plurality of transconductance sub-units in each transconductance unit are configured to adopt the PMOS transistors of different sizes and the NMOS transistors of different sizes.

* * * * *